(12) United States Patent
Cho et al.

(10) Patent No.: US 11,580,914 B2
(45) Date of Patent: Feb. 14, 2023

(54) DISPLAY APPARATUS

(71) Applicant: Samsung Display Co., Ltd., Yongin-si (KR)

(72) Inventors: Seunghwan Cho, Yongin-si (KR); Youngwoo Park, Yongin-si (KR); Seokje Seong, Yongin-si (KR); Jiseon Lee, Yongin-si (KR); Wonsuk Choi, Yongin-si (KR); Jonghyun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/322,205

(22) Filed: May 17, 2021

(65) Prior Publication Data

US 2021/0375215 A1 Dec. 2, 2021

(30) Foreign Application Priority Data

May 29, 2020 (KR) ........................ 10-2020-0065184

(51) Int. Cl.
*H01L 29/04* (2006.01)
*G02F 1/136* (2006.01)
*G09G 3/3291* (2016.01)

(52) U.S. Cl.
CPC ....... *G09G 3/3291* (2013.01); *G09G 2370/22* (2013.01)

(58) Field of Classification Search
CPC .................... G09G 2300/0426; G09G 3/3233
See application file for complete search history.

(56) References Cited

U.S. PATENT DOCUMENTS

| 10,726,789 | B2 | 7/2020 | Cho et al. |
| 2005/0128416 | A1* | 6/2005 | Hashimoto ........... G02F 1/1345 349/149 |
| 2007/0045626 | A1* | 3/2007 | Murade ................. G02F 1/1345 257/59 |

(Continued)

FOREIGN PATENT DOCUMENTS

| EP | 3 767 613 | 1/2021 |
| EP | 3 813 137 | 4/2021 |

(Continued)

OTHER PUBLICATIONS

US 9,196,668 B2, 11/2015, Kim et al. (withdrawn)
Extended European search report for European Patent Application or Patent No. 21176704.1 dated Oct. 27, 2021.

*Primary Examiner* — Nan-Ying Yang
(74) *Attorney, Agent, or Firm* — Kile Park Reed & Houtteman PLLC

(57) ABSTRACT

A display apparatus includes a substrate, a first data line in a display area, a first input line in a peripheral area, and a first connecting wire electrically connected to the first input line in a peripheral area of the substrate. The first connecting wire transfers a first input signal from the first input line to the first data line. The first connecting wire includes a first connecting line disposed in a display area of the substrate and extending in the first direction, and a second connecting line electrically connected to the first connecting line and extending in a second direction intersecting the first direction. The first connecting line and the second connecting line are disposed on different layers.

26 Claims, 38 Drawing Sheets

(56) References Cited

U.S. PATENT DOCUMENTS

| | | | |
|---|---|---|---|
| 2015/0185940 A1* | 7/2015 | Han | G06F 3/04164 |
| | | | 345/174 |
| 2017/0047347 A1 | 2/2017 | Kim et al. | |
| 2019/0237487 A1 | 8/2019 | Zhang et al. | |
| 2019/0385522 A1 | 12/2019 | Song et al. | |
| 2020/0091268 A1 | 3/2020 | Cho et al. | |
| 2021/0273035 A1 | 9/2021 | Cho et al. | |

FOREIGN PATENT DOCUMENTS

| | | |
|---|---|---|
| EP | 3 876 282 | 9/2021 |
| KR | 10-1486038 | 1/2015 |
| KR | 10-2019-0143549 | 12/2019 |
| KR | 10-2020-0006211 | 1/2020 |
| KR | 10-2020-0010697 | 1/2020 |
| KR | 10-2020-0017012 | 2/2020 |
| WO | 2020/017835 | 1/2020 |
| WO | 2020/091228 | 5/2020 |

* cited by examiner

DISPLAY APPARATUS

CROSS-REFERENCE TO RELATED APPLICATION(S)

This application claims priority to and benefits of Korean Patent Application No. 10-2020-0065184 under 35 U.S.C. § 119, filed on May 29, 2020, in the Korean Intellectual Property Office, the entire contents of which are incorporated herein by reference.

BACKGROUND

1. Technical Field

One or more embodiments relate to a display apparatus, and, to a display apparatus, in which a non-display area may be reduced and high quality images may be reproduced.

2. Description of the Related Art

In general, in a display apparatus such as an organic light-emitting display apparatus, a thin film transistor may be in each (sub-)pixel in order to control a luminance, for example, of each (sub-)pixel. Such thin film transistor may control a luminance, for example, of a corresponding (sub-)pixel according to a data signal transferred thereto.

A data signal may be transferred to each (sub-)pixel via a data line from a driver in a peripheral area may be on an outer portion of a display area.

In a display apparatus according to the related art, an area of a region in which a driver, for example may be located or an area of a portion from the driver to a display area may be increased, and accordingly, an area of a dead space in which a display element may not be provided may be excessively large.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus capable of reproducing high quality images, while a non-display area may be reduced. However, the above technical features are by way of example, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a substrate including a display area and a peripheral area adjacent to the display area; a first data line disposed in the display area, the first data line extending in a first direction; a first input line disposed in the peripheral area, the first input line extending from the peripheral area towards the display area; and a first connecting wire electrically connected to the first input line in the peripheral area, the first connecting line transferring a first input signal from the first input line to the first data line, wherein the first connecting wire may include a first connecting line disposed in the display area and extending in the first direction; and a second connecting line electrically connected to the first connecting line and extending in a second direction intersecting the first direction, and the first connecting line and the second connecting line may be disposed on different layers.

The display apparatus may further include a data pad portion disposed in the peripheral area, wherein an end of the first input line may be electrically connected to the data pad portion, and another end of the first input line may be electrically connected to the first connecting line.

The display apparatus may further include a second data line disposed in the display area between the first connecting line and the first data line, the second data line being separated from the first data line and extending in the first direction, wherein the second connecting line may extend below the second data line and may not be electrically connected to the second data line.

The first connecting wire may include a third connecting line disposed in the display area, the third connecting line extending in the first direction, and the third connecting line may be electrically connected to the first data line in the peripheral area.

The second connecting line may be electrically connected to the first data line in the display area.

The display apparatus may further include a second data line disposed in the display area between the first connecting line and the first data line, the second data line being separated from the first data line and extending in the first direction; a second input line disposed in the peripheral area, the first input line extending from the peripheral area towards the display area; and a second connecting wire electrically connected to the second input line in the peripheral area, the second connecting line transferring a second input signal from the second input line to the second data line, wherein the second connecting wire may include a third connecting line disposed in the display area and extending in the first direction; and a fourth connecting line electrically connected to the third connecting line and extending in a second direction intersecting the first direction, and a length a path of the first connecting wire passing the first connecting line and the second connecting line may be equal to a length of a path of the second connecting line passing the third connecting line and the fourth connecting line.

The display apparatus may further include a first dummy line extending in the first direction from the first connecting line, the first dummy line being disconnected from the first connecting line, and a second dummy line extending in the second direction from the second connecting line, the second dummy line being disconnected from the second connecting line.

The first connecting line and the first dummy line may have a same layered structure.

The second connecting line and the second dummy line may have a same layered structure.

The first connecting wire may not be electrically connected to the first dummy line and the second dummy line.

The display apparatus may further include a third dummy line disposed in parallel with at least a portion of the first dummy line, wherein the third dummy line may extend over the second connecting line and may not be in contact with the second connecting line, and an insulating layer may be disposed between the third dummy line and the second connecting line.

The insulating layer may include a dummy groove located at a portion where the third dummy line and the second connecting line may overlap each other.

The insulating layer may include a dummy hole located in at least a portion of a region where the third dummy line is located.

The second connecting line may not be located in a portion of the dummy hole.

The dummy hole may at least partially expose a lower insulating layer disposed below the second connecting line, and the third dummy line may electrically contact an upper surface of the lower insulating layer via the dummy hole.

The display apparatus may further include a fourth dummy line disposed in parallel with at least a portion of the second dummy line, wherein the fourth dummy line may extend below the first connecting line and may not be in contact with the first connecting line, and an insulating layer may be disposed between the fourth dummy line and the first connecting line.

The first data line and the first connecting line of the first connecting wire may be disposed on a same layer.

The display apparatus may further include a pixel disposed in the display area and including a pixel circuit and a display element electrically connected to the pixel circuit, wherein the pixel circuit may include a thin film transistor comprising a semiconductor layer and a gate electrode that at least partially overlaps the semiconductor layer; a storage capacitor including the gate electrode as a first electrode and a second electrode disposed on the first electrode; a node connecting line disposed on the second electrode, the node connecting line including an end electrically connected to the gate electrode; and a conductive layer disposed on the node connecting line, the conductive layer completely overlapping the node connecting line.

The pixel circuit may further include a driving voltage line disposed on the conductive layer, the driving voltage line extending in the first direction and being electrically connected to the conductive layer.

The driving voltage line, the first data line, and the first connecting line may be disposed on a same layer.

The second connecting line and the conductive layer may be disposed on a same layer.

The pixel circuit may include an initialization voltage line extending in the second direction, and the initialization voltage line and the node connecting line may be disposed on a same layer.

The initialization voltage line may overlap the second connecting line.

According to one or more embodiments, a display apparatus may include a substrate including a display area and a peripheral area adjacent to the display area; a first data line and a second data line extending in a first direction in the display area, the first data line and the second data line being separated from each other; an input line disposed in the peripheral area, the input line extending from the peripheral area towards the display area; and a connecting wire including an end electrically connected to the input line and another end electrically connected to the first data line, the connecting wire passing the display area and arching around at least a portion of the display area, wherein the connecting wire may include a first connecting line extending in the first direction and a second connecting line extending in a second direction intersecting the first direction, the second connecting line may extend below the second data line, and the second connecting line and the first connecting line may be disposed on different layers.

The input line may be bent at an angle of about 45° or less with respect to the first direction.

Other aspects, features and advantages of the disclosure will become better understood through the accompanying drawings, the claims and the detailed description.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
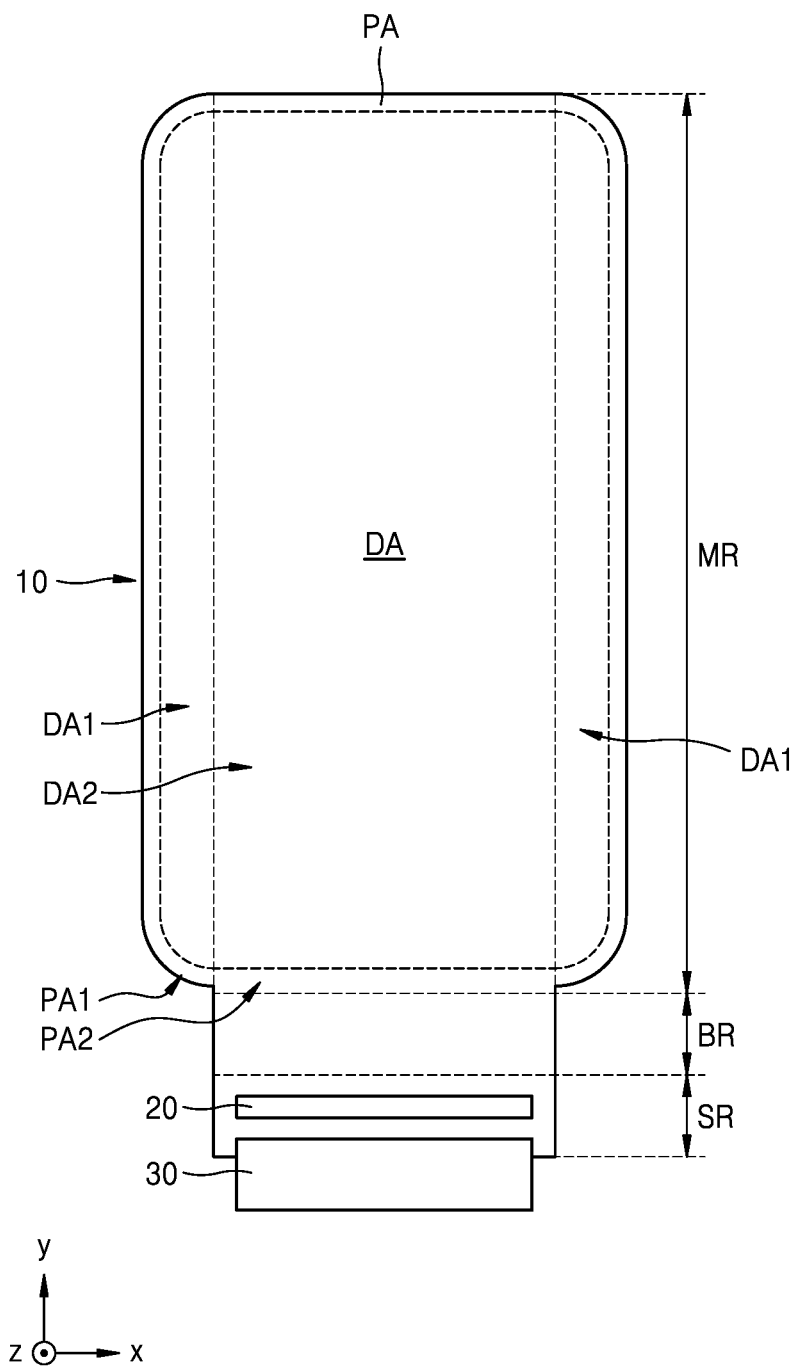
FIG. 1 is a plan view showing a portion or region of a display apparatus according to an embodiment.

As the disclosure allows for various changes and numerous embodiments, embodiments will be illustrated in the drawings and described in detail in the written description. The attached drawings for illustrating one or more embodiments are referred to in order to gain an understanding, the merits thereof, and the objectives accomplished by the implementation. However, the embodiments may have different forms and should not be construed as being limited to the descriptions set forth herein.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components must not be limited to the above terms. The above terms are used only to distinguish one component from another. For example, a first element could be termed a second element, and, similarly, a second element could be termed a first element, without departing from the scope of example embodiments.

An expression used in the singular encompasses the expression of the plural, unless it has a clearly different meaning in the context.

In the specification, it is to be understood that the terms such as "including," "having," and "comprising" and variations thereof are intended to indicate the existence of the features or components disclosed in the specification, and are not intended to preclude the possibility that one or more other features or components may exist or may be added.

It will be understood that when a layer, region, or component is referred to as being "formed on" another layer, region, or component, it may be directly or indirectly formed on the other layer, region, or component. For example, intervening layers, regions, or components may be present.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

In addition, terms such as "below," "lower," "above," "upper," and the like are used to describe the relationship of the configurations shown in the drawings. The terms are used as a relative concept and may be described with reference to the direction indicated in the drawings.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

When a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. In other words, since sizes and thicknesses of components in the drawings are arbitrarily illustrated for convenience of explanation, the following embodiments are not limited thereto.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a display apparatus according to an embodiment is described as an organic light-emitting display apparatus as an example, but the display apparatus is not limited thereto. In an embodiment, a display apparatus may include an inorganic light-emitting display apparatus, an inorganic electroluminescence (EL) display apparatus, a quantum dot light-emitting display apparatus, for example. For example, a light-emitting layer of a display element included in the display apparatus may include an organic material, an inorganic material, quantum dots, an organic material and quantum dots, or an inorganic material and quantum dots.

Figure 2:
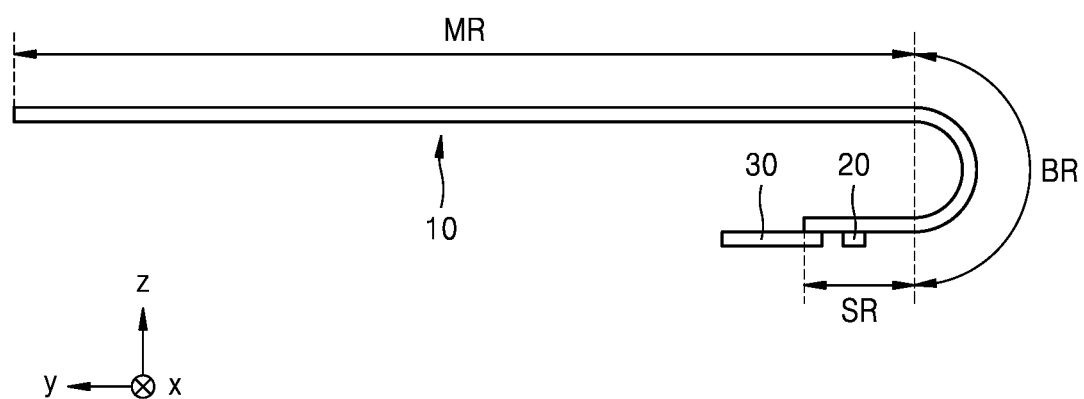
FIG. 2 is a side view of the display apparatus of FIG. 1.

FIG. 1 is a plan view showing a portion of the display apparatus according to an embodiment, and FIG. 2 is a side view of the display apparatus of FIG. 1. The display apparatus according to an embodiment may be partially bent, but is shown not to be bent in FIG. 1 for convenience of description.

Referring to FIG. 1 and FIG. 2, the display apparatus may include a display panel 10. Any type of display apparatus may be used, provided that the display apparatus may include the display panel 10. For example, the display apparatus may denote various products such as a smartphone, a tablet, a laptop computer, a television, a billboard, for example.

The display panel 10 may include a display area DA and a peripheral area PA on an outer portion of the display area DA. The display area DA displays images, and may include pixels. The display area DA may have various shapes, for example, a substantially circular shape, a substantially elliptical shape, a substantially polygonal shape, or other predetermined shape, for example. In FIG. 1, the display area DA may have a substantially rectangular shape including substantially round corners.

The peripheral area PA may be at the outside of or may be adjacent to the display area DA. The peripheral area PA may include a first peripheral area PA1 and a second peripheral area PA2, wherein the first peripheral area PA1 may at least partially surround or may be adjacent to the display area DA and the second peripheral area PA2 may extend to a side (for example, -y direction) of the display area DA. A width of the second peripheral area PA2 in one direction (for example, the x-axis direction) may be less than that of the display area DA. This is because at least a part of the second peripheral area PA2 may be easily bent, as described later.

The display area DA may include a second area DA2 and first areas DA1, wherein the second area DA2 may be at a center portion and the first areas DA1 may be at opposite sides of the second area DA2. The first areas DA1 may be regions at edge portions (for example, in -x direction or +x direction), not in a center portion of the display panel 10, based on the second area DA2. A width of the second area DA2 in one direction (for example, the x-axis direction) may be substantially the same as a width of the second peripheral area PA2.

Because the display panel 10 may include a substrate 100 (see FIG. 3), it may be also described that the substrate 100 may include the display area DA and the peripheral area PA. Hereinafter, it will be described that the substrate 100 may include the display area DA and the peripheral area PA for convenience of description.

The display panel 10 may also include a main region MR, a bending region BR on an outer portion of the main region MR, and a sub-region SR opposite to the main region MR based on the bending region BR. As shown in FIG. 2, the display panel 10 may be bent at the bending region BR, and thus, the sub-region SR may at least partially overlap the main region MR in a case that the display panel 10 is seen from a z-axis direction. One or more embodiments are not limited to a bendable display apparatus, but may be also applied to a display apparatus that may not be bendable. The sub-region SR may be a non-display area, as described later. Because the display panel 10 is bent at the bending region BR, the non-display area is not visible or may be visible such that a visible area of the non-display area is reduced in a case that the display apparatus is seen from the front (in -z direction).

A data pad portion 20 may be in the sub-region SR of the display panel 10. The data pad portion 20 may include an integrated circuit (for example, a driving chip) for driving the display panel 10. The integrated circuit may be a data driving integrated circuit for generating a data signal, but one or more embodiments are not limited thereto.

The data pad portion 20 may be mounted on the sub-region SR of the display panel 10. Although the data pad portion 20 is mounted on the same surface as a display surface of the display area DA, the data pad portion 20 may be on a rear surface of the main region MR in a case that the display panel 10 is bent at the bending region BR as described above.

A printed circuit board 30, for example, may be attached to an end portion of the sub-region SR of the display panel 10. The printed circuit board 30, for example, may be electrically connected to the data pad portion 20, for example, via a pad PCB-P on the substrate.

Figure 3:
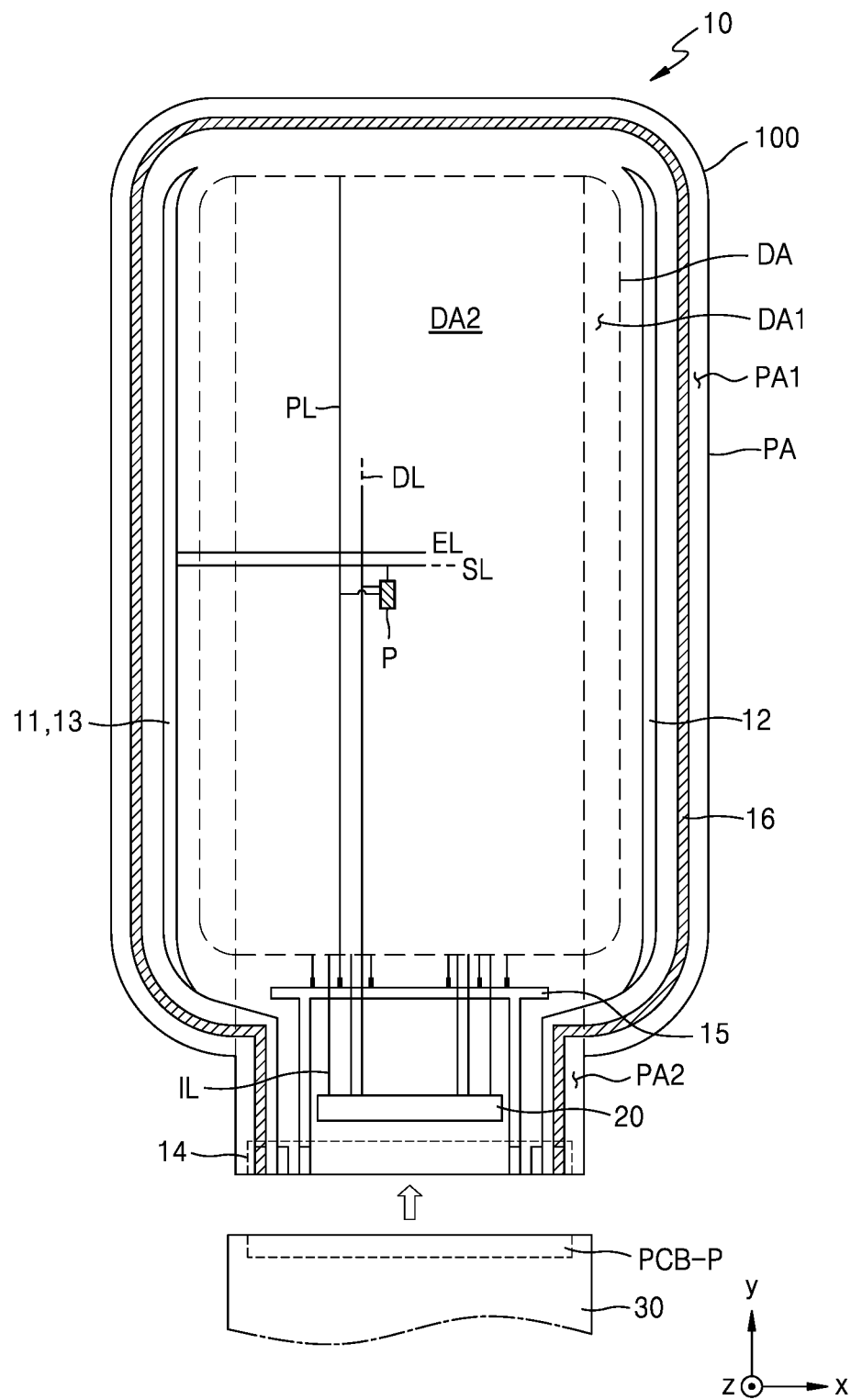
FIG. 3 is a plan view of a display panel according to an embodiment.

FIG. 3 is a plan view of the display panel 10 according to an embodiment.

Referring to FIG. 3, the display panel 10 may include the substrate 100. Various elements of the display panel 10 may be disposed on the substrate 100. The substrate 100 may include glass, metal, or a polymer resin. In a case that the display panel 10 is bent at the bending region BR as described above, the substrate 100 may be required to be flexible or bendable. In this case, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified, for example, the substrate 100 may have a multi-layered structure including two layers each including a polymer resin and a barrier layer including an inorganic material such as silicon oxide, silicon nitride, silicon oxynitride, for example, between the two layers.

Pixels P may be disposed in the display area DA. Each of the pixels P denotes a sub-pixel, and may be implemented by a display element such as an organic light-emitting diode OLED. Each of the pixels P may emit, for example, red light, green light, blue light, or white light.

Each of the pixels P may be electrically connected to external circuits disposed in the peripheral area PA, that may be, the non-display area. A first scan driving circuit 11, a second scan driving circuit 12, an emission control driving circuit 13, a terminal 14, a first power supply line 15, and a second power supply line 16 may be in the peripheral area PA.

The first scan driving circuit 11 may provide each pixel P with a scan signal via a scan line SL. The second scan driving circuit 12 may be arranged or disposed in parallel with the first scan driving circuit 11 with the display area DA arranged or disposed therebetween. Some or a predetermined number of the pixels P in the display area DA may be electrically connected to the first scan driving circuit 11, and the other pixels P may be electrically connected to the second scan driving circuit 12. In an embodiment, the second scan driving circuit 12 may be omitted.

The emission control driving circuit 13 is at a side of the first scan driving circuit 11, and may provide the pixel P with an emission control signal via an emission control line EL. In FIG. 3, the emission control driving circuit 13 may be disposed only at one or a side of the display area DA, but the emission control driving circuit 13 may be at opposite sides of the display area DA, like the first and second scan driving circuits 11 and 12.

The terminal 14 may be disposed in the second peripheral area PA2 of the substrate 100. The terminal 14 may not be covered or overlapped by an insulating layer, but may be exposed and may be electrically connected to a printed circuit board 30. The pad PCB-P of the printed circuit board 30 may be electrically connected to the terminal 14 of the display panel 10.

The printed circuit board 30 may transfer a signal or power from a controller (not shown) to the display panel 10. A control signal generated by the controller may be respectively transferred to the driving circuits 11, 12, and 13 (for example, the first scan driving circuit 11, the second scan driving circuit 12, and the emission control driving circuit 13) via the printed circuit board 30. Also, the controller may provide the first and second power supply lines 15 and 16 with first and second power voltages ELVDD and ELVSS (see FIG. 4). The first power voltage (or driving voltage) ELVDD may be provided to each of pixel P via a power voltage line PL that may be electrically connected to the first power supply line 15, and the second power voltage (or common voltage) ELVSS may be provided to an opposite electrode of the pixel P electrically connected to the second power supply line 16. The first power supply line 15 may extend in one direction (for example, x-direction) under or below the second area DA2. The second power supply line 16 may have a substantially loop shape having an open side and may partially surround the display area DA.

Also, the controller generates a data signal, and the data signal is transferred to an input line IL via the data pad portion 20 and may be transferred to the pixel P via a data line DL electrically connected to the input line IL.

Figure 4A:
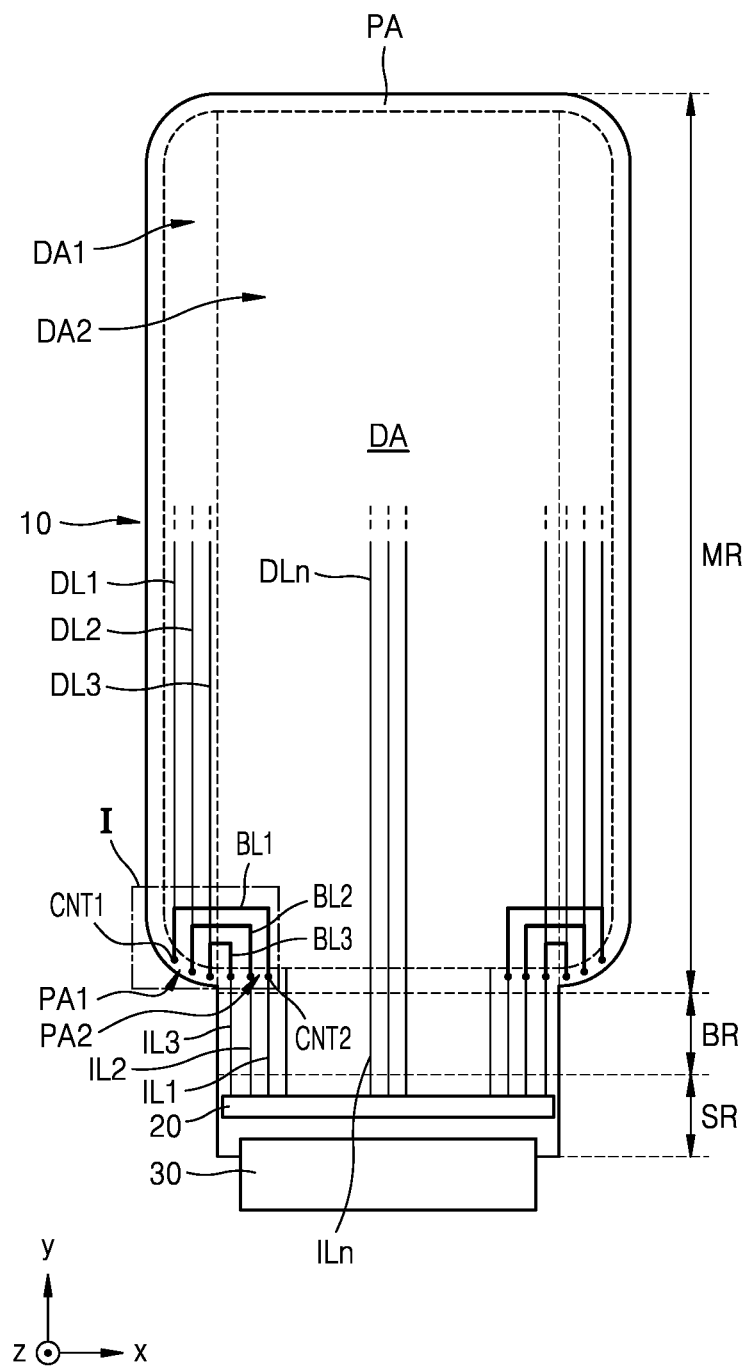
FIG. 4A is a conceptual diagram of data lines, connecting wires, and input lines in the display apparatus of FIG. 1.
Figure 4B:
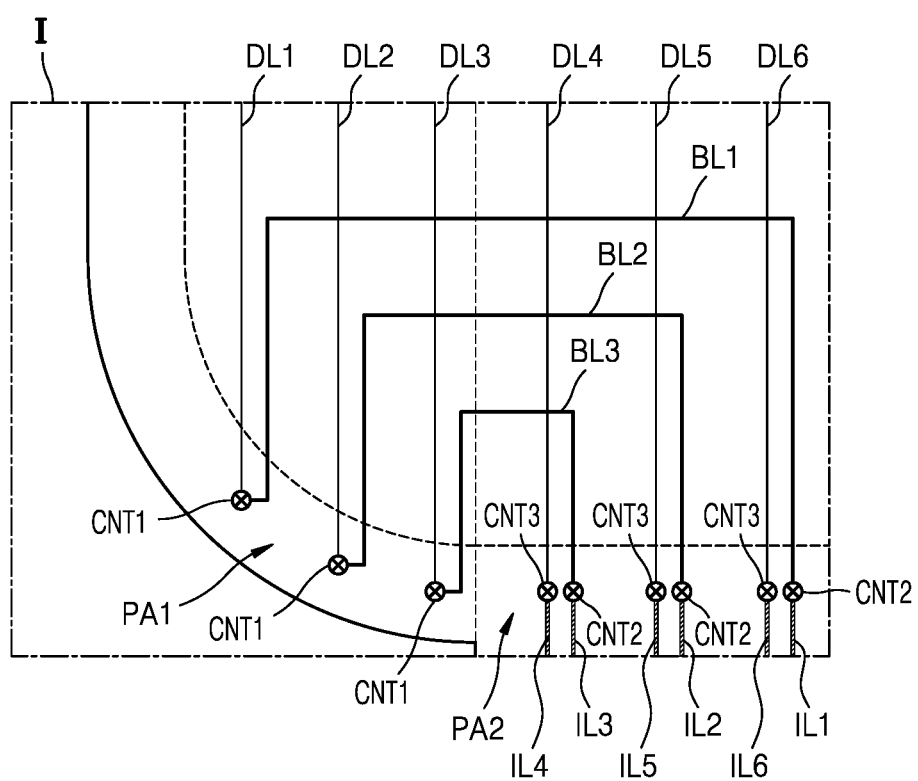
FIG. 4B is a plan view showing an enlarged view of a region I in FIG. 4A.
Figure 4C:
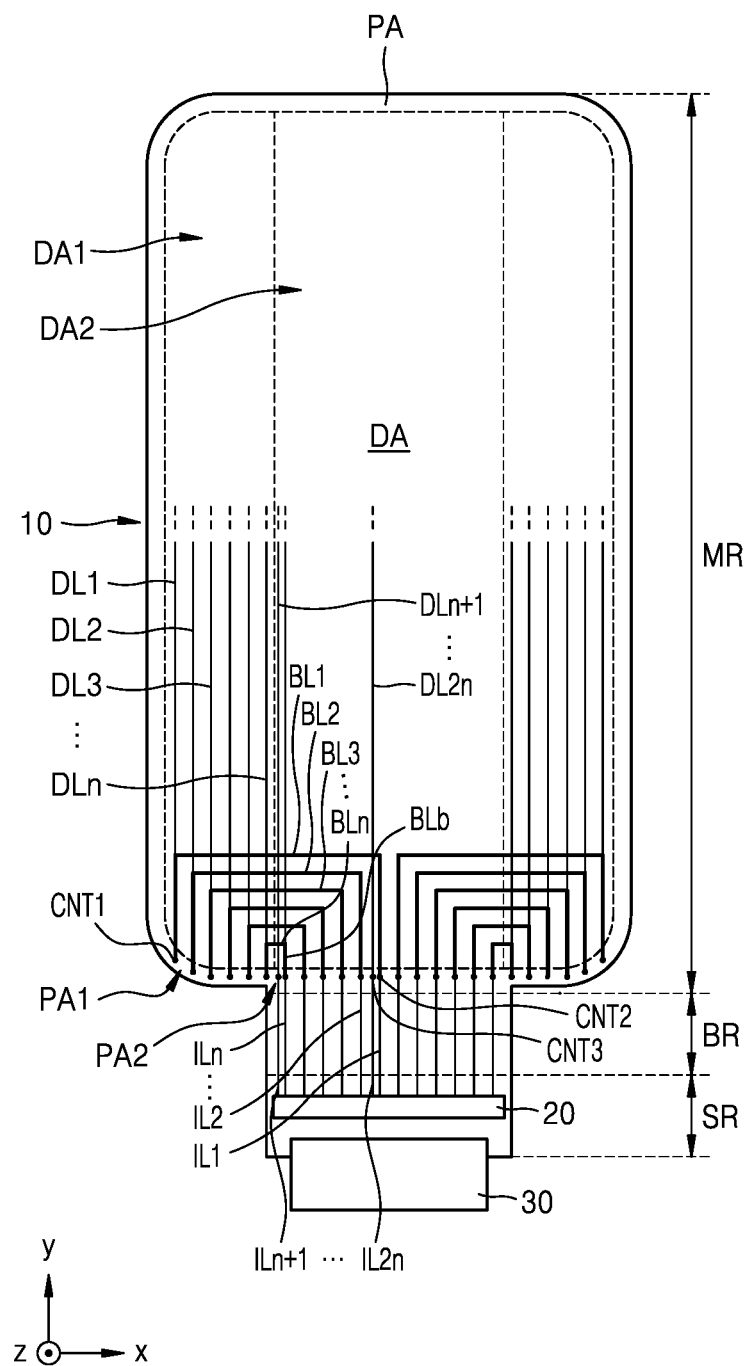
FIG. 4C is a diagram showing a modified example of FIG. 4A.

FIG. 4A is a conceptual diagram of data lines, connecting wires, and input lines in the display apparatus of FIG. 1, and FIG. 4B is a plan view showing an enlarged view of a region I of FIG. 4A. FIG. 4C is a diagram showing a modified example of FIG. 4A.

Referring to FIGS. 4A and 4B, various signals may be applied to the display area DA. For example, a data signal, for example, for adjusting a brightness in each pixel may be applied to the display area DA, and to do this, data lines DL1 to DLn that may be in parallel with one another may be disposed in the display area DA on the substrate 100 as shown in FIGS. 4A and 4B. In addition to the data lines DL1 to DLn, various lines such as a power line (not shown), a scan line (not shown), for example, may be in the display area DA.

The data lines DL1 to DLn may cross over the display area DA and may be arranged or disposed in a first direction (for example, +y direction). In FIGS. 4A and 4B, first to third data lines DL1 to DL3 may be in the first areas DA1, and fourth to sixth data lines DL4 to DL6 may be in the second area DA2. The fourth to sixth data lines DL4 to DL6 are in the second area DA2, and may at least partially overlap connecting wires BL1 to BL3 that will be described later. Some or a predetermined number of the data lines DL1 to DLn (for example, the DLn) may be in the second area DA2, and may not overlap the connecting wires BL1 to BL3 that will be described later. In FIG. 4A, three data lines are in the first areas DA1 for convenience of description, but one or more embodiments are not limited thereto.

In the second peripheral area PA2, input lines IL1 to IL6 may be located or disposed to input data signals to the data lines DL1 to DLn. The input lines IL1 to IL6 may be arranged or disposed from the second peripheral area PA2 towards the second area DA2.

Connecting relations among the data lines DL1 to DLn, the input lines IL1 to IL6, and the connecting wires BL1 to BL3 will be described with reference to FIG. 4B.

Referring to FIG. 4B, first to third input lines IL1 to IL3 may be electrically connected to the first to third data lines DL1 to DL3 via the first to third connecting wires BL1 to BL3. The first to third connecting wires BL1 to BL3 may be arranged or disposed passing or extending through the display area DA after arching around a portion of the display area DA, which may be adjacent to the peripheral area PA. The first input line IL1 may be electrically connected to the first data line DL1 via the first connecting wire BL1, second input line IL2 may be electrically connected to the second data line DL2 via the second connecting wire BL2, and the third input wire BL3 may be electrically connected to the third data line DL3 via the third connecting wire BL3.

In FIG. 4A, some or a predetermined number of the input lines IL1 to ILn (for example, ILn) may be directly electrically connected to some or a predetermined number of the data lines DL1 to DLn (for example, DLn). However, one or more embodiments are not limited thereto.

The first to third input lines IL1 to IL3 may be respectively electrically connected to the first to third connecting wires BL1 to BL3 via a second contact hole CNT2. The first to third connecting wires BL1 to BL3 may be respectively electrically connected to the first to third data lines DL1 to DL3 via a first contact hole CNT1. In FIGS. 4A and 4B, the first contact hole CNT1 and the second contact hole CNT2 may be in the peripheral area PA, but one or more embodiments are not limited thereto. In another embodiment, the first contact hole CNT1 and/or the second contact hole CNT2 may be in the display area DA. As such, the first input line IL1 may transfer a first input signal to the first data line DL1, the second input line IL2 may transfer a second input signal to the second data line DL2, and the third input line IL3 may transfer a third input signal to the third data line DL3.

In more detail, the first to third connecting wires BL1 to BL3 respectively have end portions electrically connected to the first to third input lines IL1 to IL3 via the second contact hole CNT2 in the second peripheral area PA2 and have opposite end portions electrically connected to the first to third data lines DL1 to DL3 via the first contact hole CNT1 in the first peripheral area PA1. For example, the first to third connecting wires BL1 to BL3 may respectively receive the first to third input signals from the first to third input lines IL1 to IL3, and may transfer the first to third input signals to the first to third data lines DL1 to DL3. The first to third connecting wires BL1 to BL3 may be disposed on the same layer as or different layers from the first to third input lines IL1 to IL3.

In an embodiment, FIGS. 4A and 4B show a structure, in which the opposite end portions of the first to third connecting wires BL1 to BL3 may be electrically connected to the first to third data lines DL1 to DL3 via the first contact hole CNT1 in the first peripheral area PA1, but in another embodiment, the opposite end portions of the first to third connecting wires BL1 to BL3 may be electrically connected to the first to third data lines DL1 to DL3 in a first area DA1. The first to third connecting wires BL1 to BL3 may pass or extend through a first area DA1 and the second area DA2 and may overlap the second data line DL2 and the third data line DL3 between opposite end portions thereof.

Fourth to sixth data lines DL4 to DL6 may be disposed on the second area DA2. Different from the first to third data lines DL1 to DL3 in the first areas DA1, the fourth to sixth data lines DL4 to DL6 may be directly electrically connected to the fourth to sixth input lines IL4 to IL6 to receive fourth to sixth input signals. The fourth to sixth data lines DL4 to DL6 may be electrically connected respectively to the fourth to sixth input lines IL4 to IL6 via a third contact hole CNT3 in the second peripheral area PA2.

The first to sixth input lines IL1 to IL6 shown in FIG. 4B may be at the same layer or some or a predetermined number of the first to sixth input lines IL1 to IL6 may be disposed on different layers from each other. In an embodiment, the first to sixth input lines IL1 to IL6 may be alternately arranged or disposed on different layers from one another. For example, the first to third input lines IL1 to IL3 may be at the same layer, and the fourth to sixth input lines IL4 to IL6 may be disposed on a different layer from that of the first to third input lines IL1 to IL3. For example, the first to third input lines IL1 to IL3 may be at the same layer as that of a gate electrode of FIG. 8 (for example, an emission control gate electrode G6), and the fourth to sixth input lines IL4 to IL6 may be at the same layer as that of a second electrode layer CE2 shown in FIG. 8.

The input lines IL1 to ILn of the display apparatus according to an embodiment as illustrated in FIG. 4A or 4C, as well as the first to sixth input lines IL1 to IL6 of FIG. 4B, may be arranged or disposed in the second direction (for example, x-direction). However, in some cases, some or a predetermined number of the input lines may be tilted by about an angle of about 45° or less with respect to the second direction (for example, x-direction). For example, some or a predetermined number of the input lines may be tilted by about 10° or less with respect to the second direction (for example, x-direction).

In the display apparatus according to an embodiment, the data lines may not be directly electrically connected to the input lines in some or a predetermined number of areas (for example, first areas DA1) of the display area DA as described above, but the input signals of the first to third input lines IL1 to IL3 may be input to the first to third data lines DL1 to DL3 via the first to the third connecting wires BL1 to BL3 that arch around a portion of the display area DA, and thus, an area of the peripheral area PA on the outside of the display area DA may be effectively reduced.

FIG. 4C shows a modified example of the example shown in FIG. 4A.

Referring to FIG. 4C, first to n-th data lines DL1 to DLn may be disposed on the first area DA1. The first to n-th data lines DL1 to DLn may be respectively electrically connected to the first to n-th connecting wires BL1 to BLn that may arch around a portion of the display area DA. One or an end in each of the first to n-th connecting wires BL1 to BLn may be electrically connected to each of the first to n-th input lines IL1 to ILn via the second contact hole CNT2, and an opposite end may be electrically connected to each of the first to n-th data lines DL1 to DLn via the first contact hole CNT1.

(n+1)-th to 2n-th data lines DLn+1 to DL2n may be on the second area DA2. In the display apparatus shown in FIG. 4C, the first to 2n-th data lines DL1 to DL2n may be symmetrically provided based on a center of the display area DA. This denotes that the total number of data lines in the display area DA is twice of 2n, for example, 4n.

The (n+1)-th to 2n-th data lines DLn+1 to DL2n may be directly electrically connected to (n+1)-th to 2n-th input lines ILn+1 to IL2n without passing or extending through the connecting wires. The (n+1)-th to 2n-th input lines ILn+1 to IL2n may be respectively adjacent to the first to n-th input lines IL1 to ILn. A detailed structure is similar to that of FIG. 4B.

As described above, in a case that the display apparatus of FIG. 4C may include the first to n-th connecting wires BL1 to BLn, the number of which is a quarter of the total number of data lines, a width of the second peripheral area PA2 may be reduced to about half the width of the display area DA.

Figure 5:
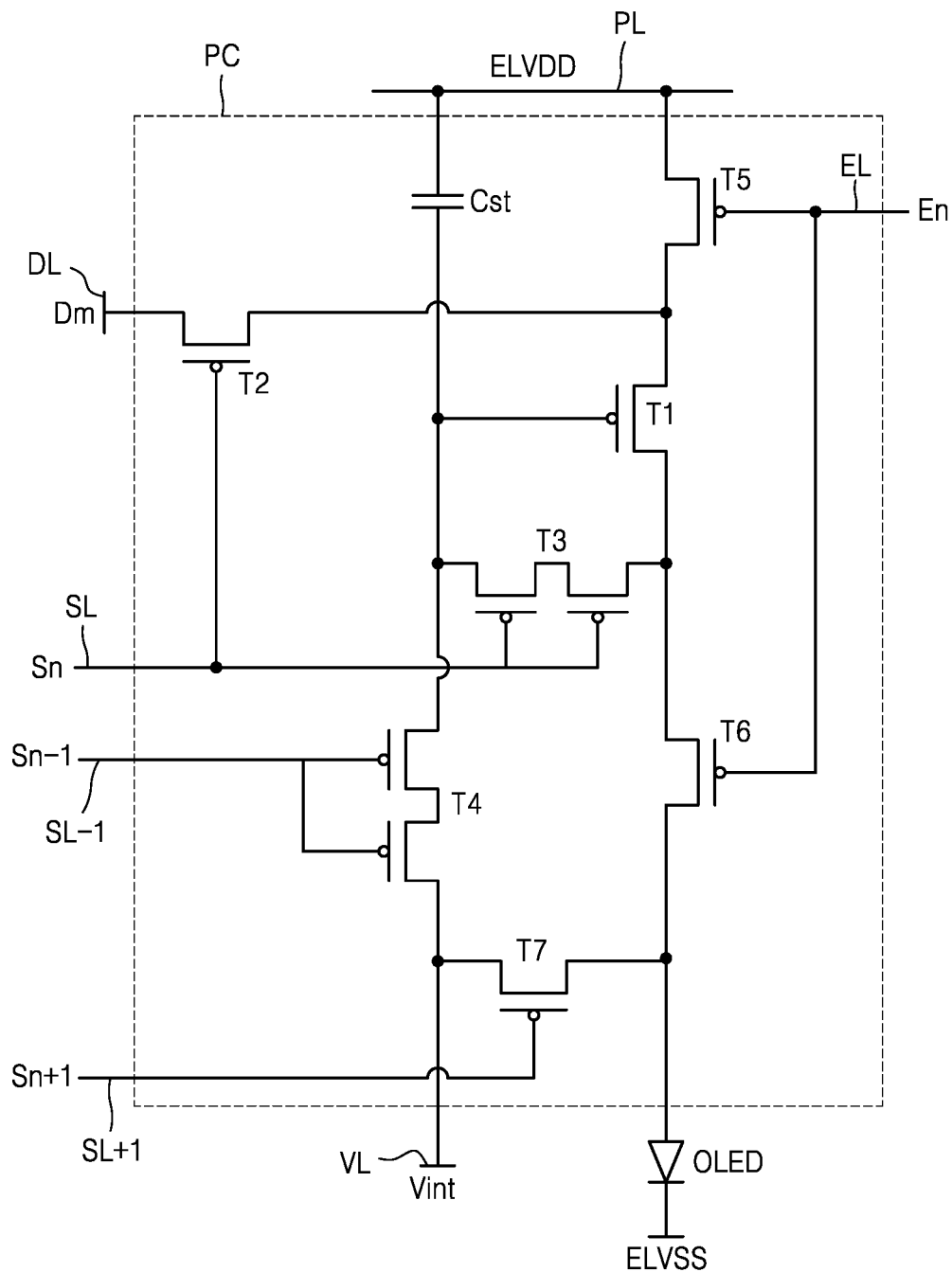
FIG. 5 is an equivalent circuit diagram of a pixel circuit for driving a pixel according to an embodiment.

FIG. 5 is an equivalent circuit diagram of a pixel circuit PC for driving a pixel according to an embodiment.

Referring to FIG. 5, the pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

In FIG. 5, every pixel circuit PC may include signal lines SL, SL−1, SL+1, EL, DL, an initialization voltage line VL, and the driving voltage line PL, but one or more embodiments are not limited thereto. In another embodiment, at least one of the signal lines SL, SL−1, SL+1, EL, and DL, and/or the initialization voltage line VL may be shared by neighboring pixel circuits.

A drain electrode of the driving thin film transistor T1 may be electrically connected to an organic light-emitting diode OLED via the emission control thin film transistor T6. The driving thin film transistor T1 receives the data signal Dm according to a switching operation of the switching thin film transistor T2 to supply a driving current to the organic light-emitting diode OLED.

A gate electrode of the switching thin film transistor T2 may be electrically connected to the scan line SL, and a source electrode of the switching thin film transistor T2 may be electrically connected to the data line DL. A drain electrode of the switching thin film transistor T2 may be electrically connected to a source electrode of the driving thin film transistor T1, and at the same time, may be electrically connected to the driving voltage line PL via the operation control thin film transistor T5.

The switching thin film transistor T2 is turned on according to a scan signal Sn received through the scan line SL and performs a switching operation for transferring the data signal Dm transferred through the data line DL to the source electrode of the driving thin film transistor T1.

A gate electrode of the compensation thin film transistor T3 may be electrically connected to the scan line SL. A source electrode of the compensation thin film transistor T3 may be electrically connected to the drain electrode of the driving thin film transistor T1, and at the same time, may be electrically connected to a pixel electrode of the organic light-emitting diode OLED via the emission control thin film transistor T6. A drain electrode of the compensation thin film transistor T3 may be electrically connected to one electrode of the storage capacitor Cst, together with the source electrode of the first initialization thin film transistor T4 and the gate electrode of the driving thin film transistor T1. The compensation thin film transistor T3 may be turned on according to the scan signal Sn transferred through the scan line SL, and may electrically connect the gate electrode and the drain electrode of the driving thin film transistor T1 to each other for diode-connecting the driving thin film transistor T1.

A gate electrode of the first initialization thin film transistor T4 may be electrically connected to the previous scan line SL−1. The drain electrode of the first initialization thin film transistor T4 may be electrically connected to the initialization voltage line VL. A source electrode of the first initialization thin film transistor T4 may be electrically connected to one electrode of the storage capacitor Cst, together with the drain electrode of the compensation thin film transistor T3 and the gate electrode of the driving thin film transistor T1. The first initialization thin film transistor T4 is turned on according to a scan signal Sn−1 transferred through the previous scan line SL−1 to transfer an initialization voltage Vint to the gate electrode of the driving thin film transistor T1 and perform an initialization operation for initializing a voltage at the gate electrode of the driving thin film transistor T1.

A gate electrode of the operation control thin film transistor T5 may be electrically connected to the emission control line EL. A source electrode of the operation control thin film transistor T5 may be electrically connected to the driving voltage line PL. A drain electrode of the operation control thin film transistor T5 may be electrically connected to the source electrode of the driving thin film transistor T1 and the drain electrode of the switching thin film transistor T2.

A gate electrode of the emission control thin film transistor T6 may be electrically connected to the emission control line EL. A source electrode of the emission control thin film transistor T6 may be electrically connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 may be simultaneously turned on according to an emission control signal En transferred through the emission control line EL to transfer the first power voltage ELVDD to the organic light-emitting diode OLED, and a driving current flows through the organic light-emitting diode OLED.

A gate electrode of the second initialization thin film transistor T7 may be electrically connected to a post scan line SL+1. A source electrode of the second initialization thin film transistor T7 may be electrically connected to the pixel electrode of an emission device. A drain electrode of the second initialization thin film transistor T7 may be electrically connected to the initialization voltage line VL. The second initialization thin-film transistor T7 is turned on according to a post scan signal Sn+1 transferred through the post scan line SL+1 to initialize the pixel electrode of the organic light-emitting diode OLED.

FIG. 5 shows an example, in which the first initialization thin film transistor T4 and the second initialization thin film transistor T7 may respectively be electrically connected to the previous scan line SL−1 and the post scan line SL+1, but one or more embodiments are not limited thereto. In another embodiment, the first initialization thin film transistor T4 and the second initialization thin film transistor T7 may be both electrically connected to the previous scan line SL−1 to be operated according to the previous scan signal Sn−1.

Another electrode of the storage capacitor Cst may be electrically connected to the driving voltage line PL. One electrode of the storage capacitor Cst may be electrically connected to the gate electrode of the driving thin film transistor T1, the drain electrode of the compensation thin film transistor T3, and the source electrode of the first initialization thin film transistor T4.

An opposite electrode (for example, a cathode) of the organic light-emitting diode OLED may receive the common voltage, for example, the second power voltage ELVSS. The organic light-emitting diode OLED emits light after receiving a driving current from the driving thin film transistor T1.

The pixel circuit PC is not limited to the number and circuit design of the thin film transistors and the storage capacitor illustrated with reference to FIG. 5, and the number and the circuit design may vary. The pixel circuits PC driving the pixels P in the display area DA may have the same structures as or different structures from one another.

Figure 6:
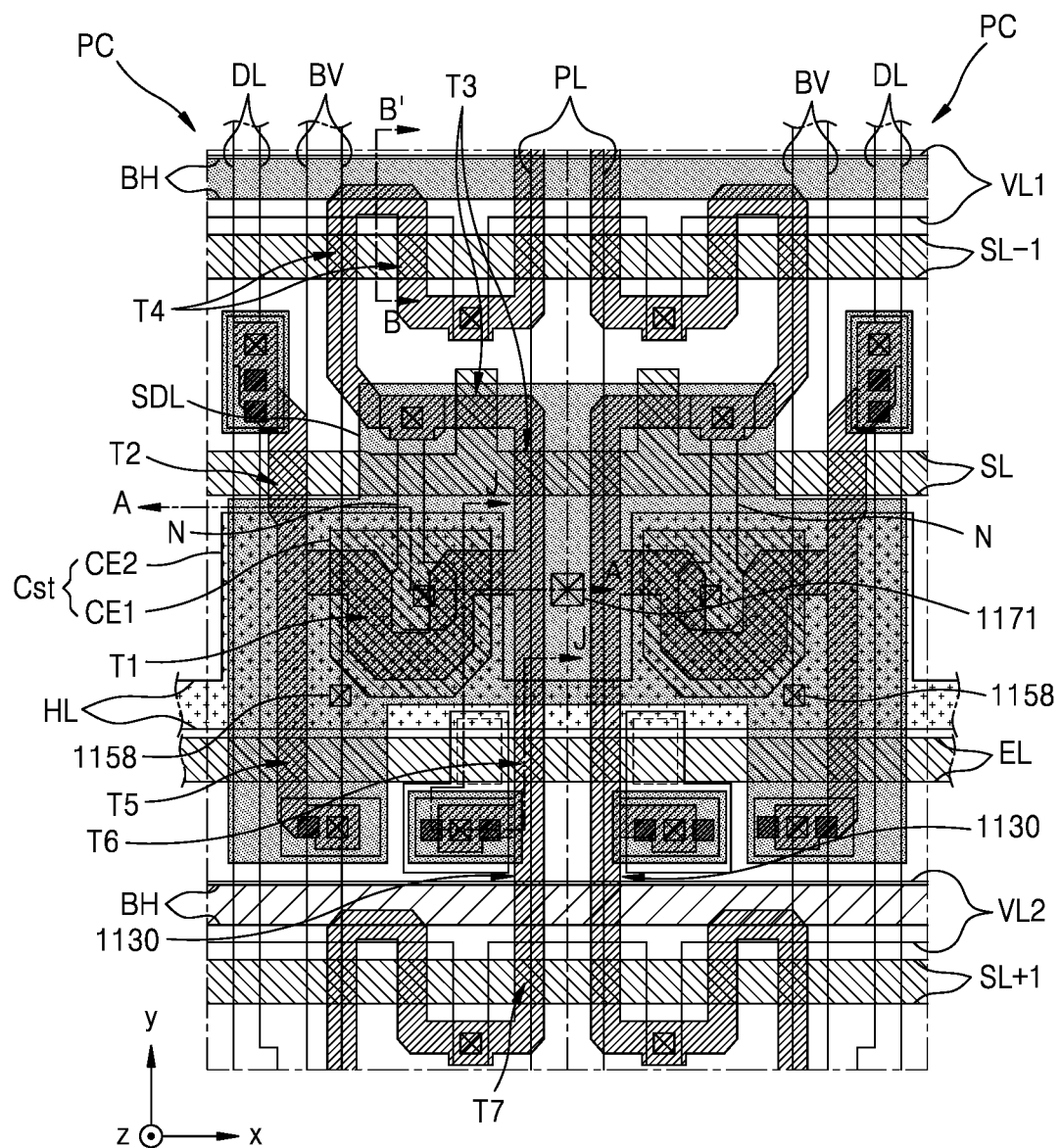
FIG. 6 is a plan view showing an arrangement of a pixel circuit for driving a pixel according to an embodiment.
Figure 7A:
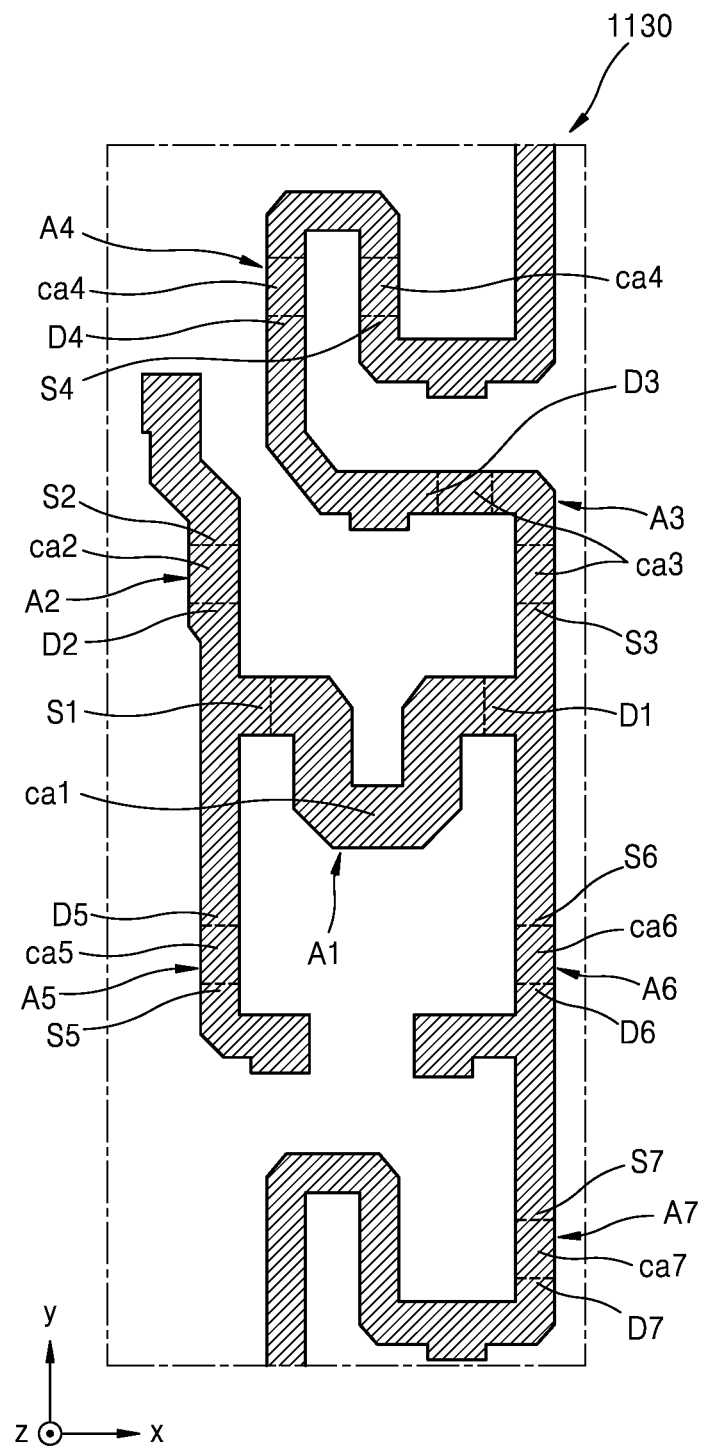
FIGS. 7A to 7F are plan views showing the stack structure of FIG. 6 for each layer.
Figure 7B:
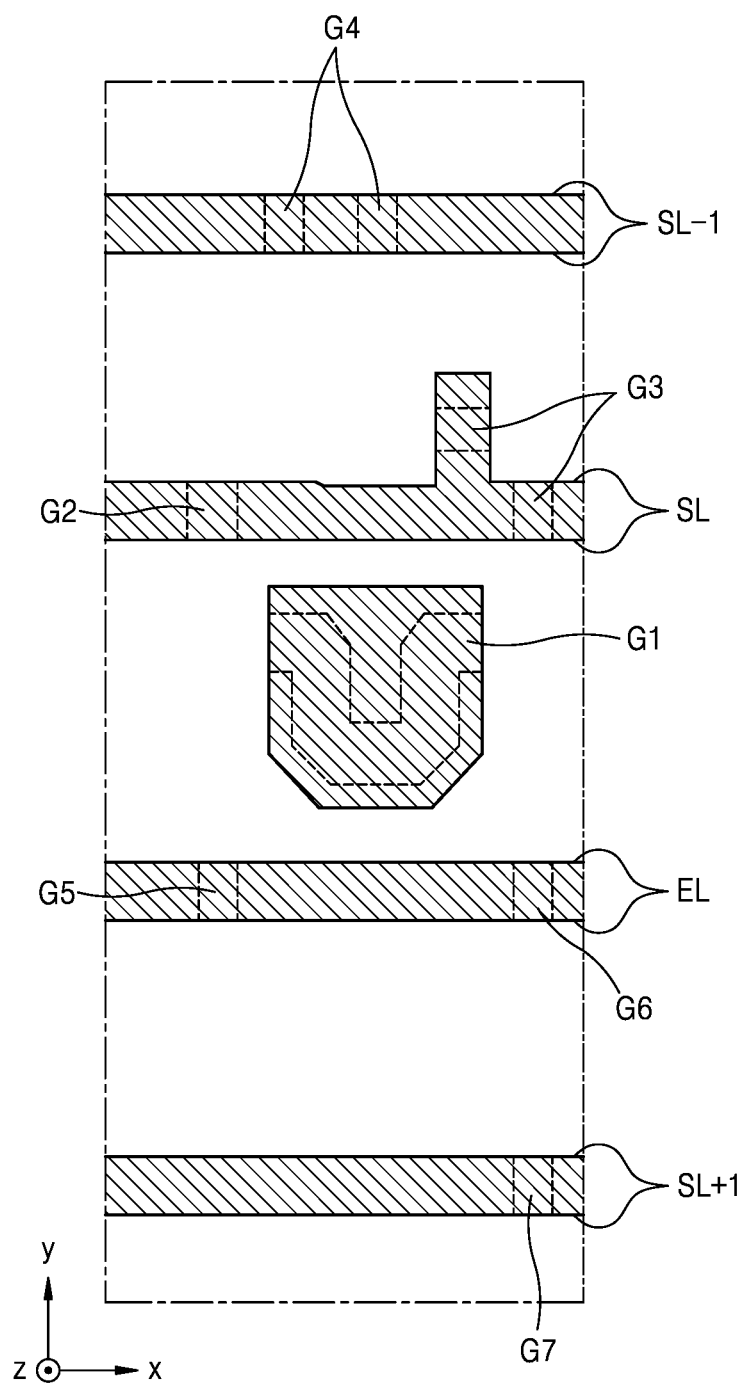
Figure 7C:
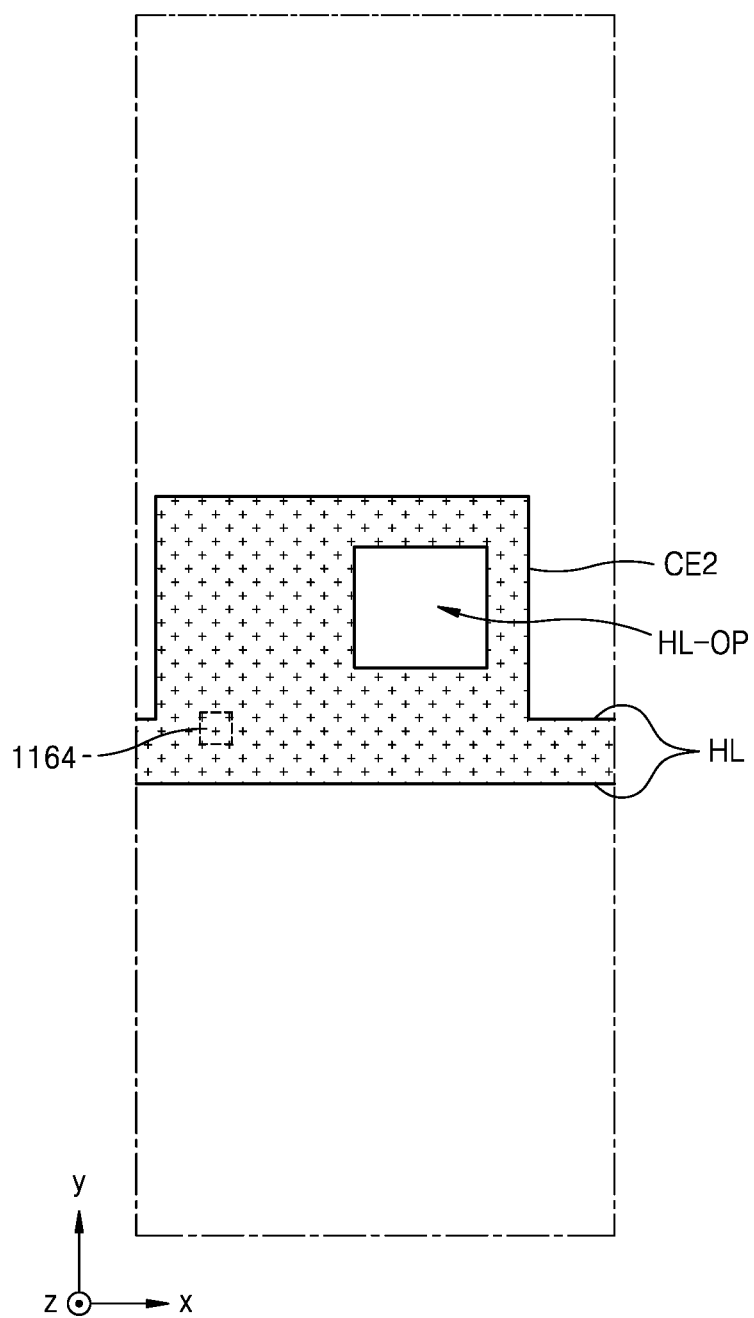
Figure 7D:
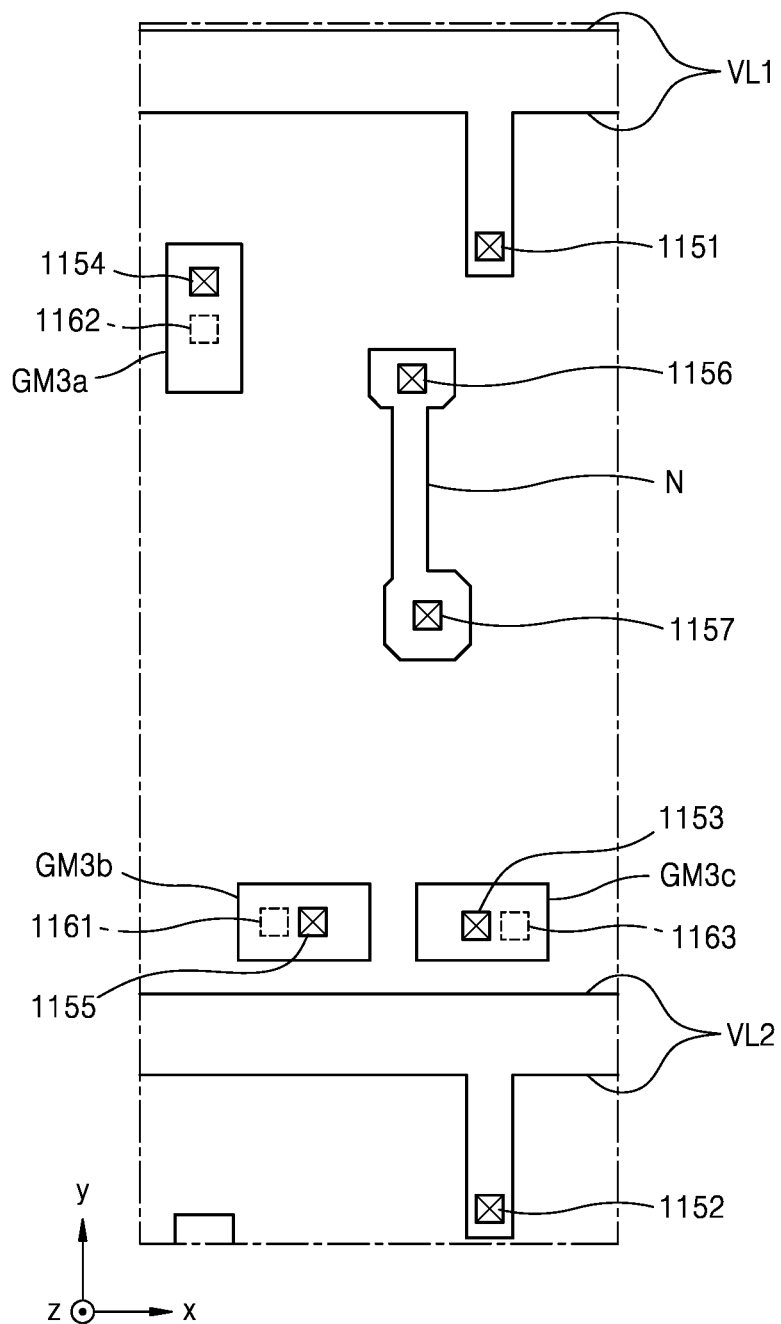
Figure 7E:
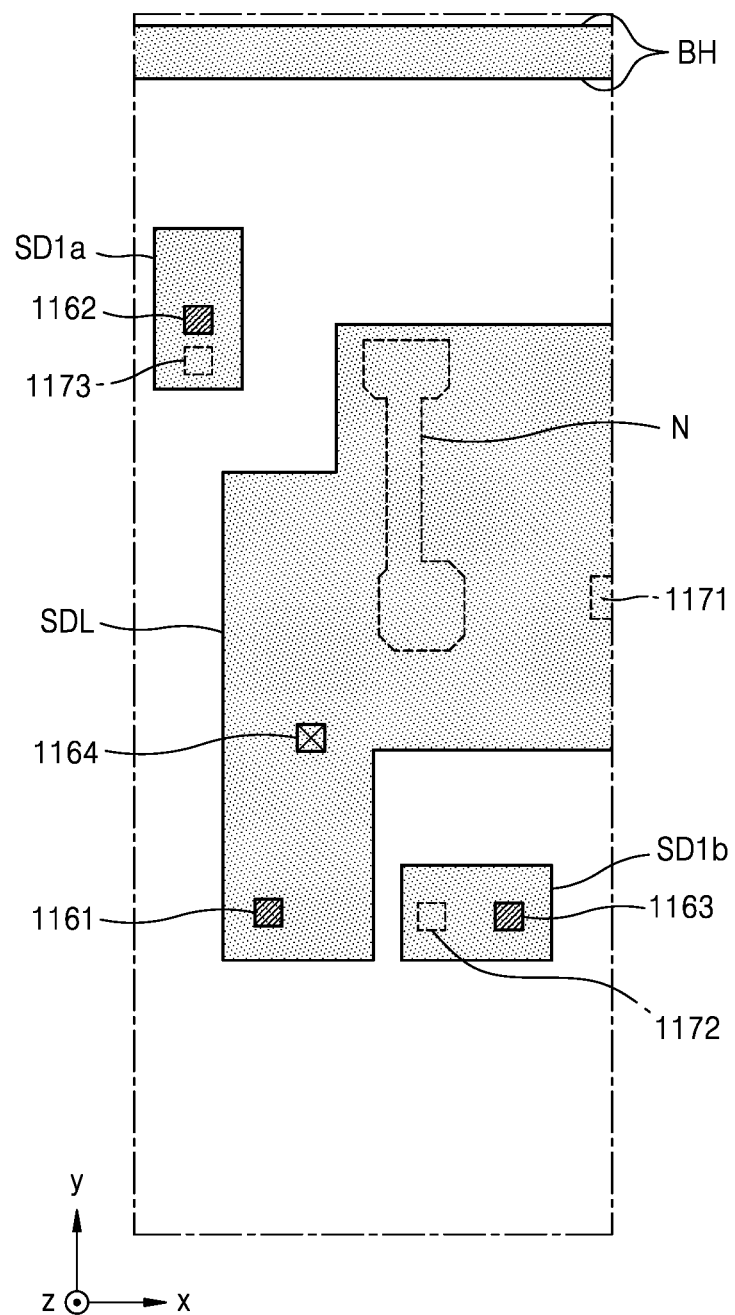
Figure 7F:
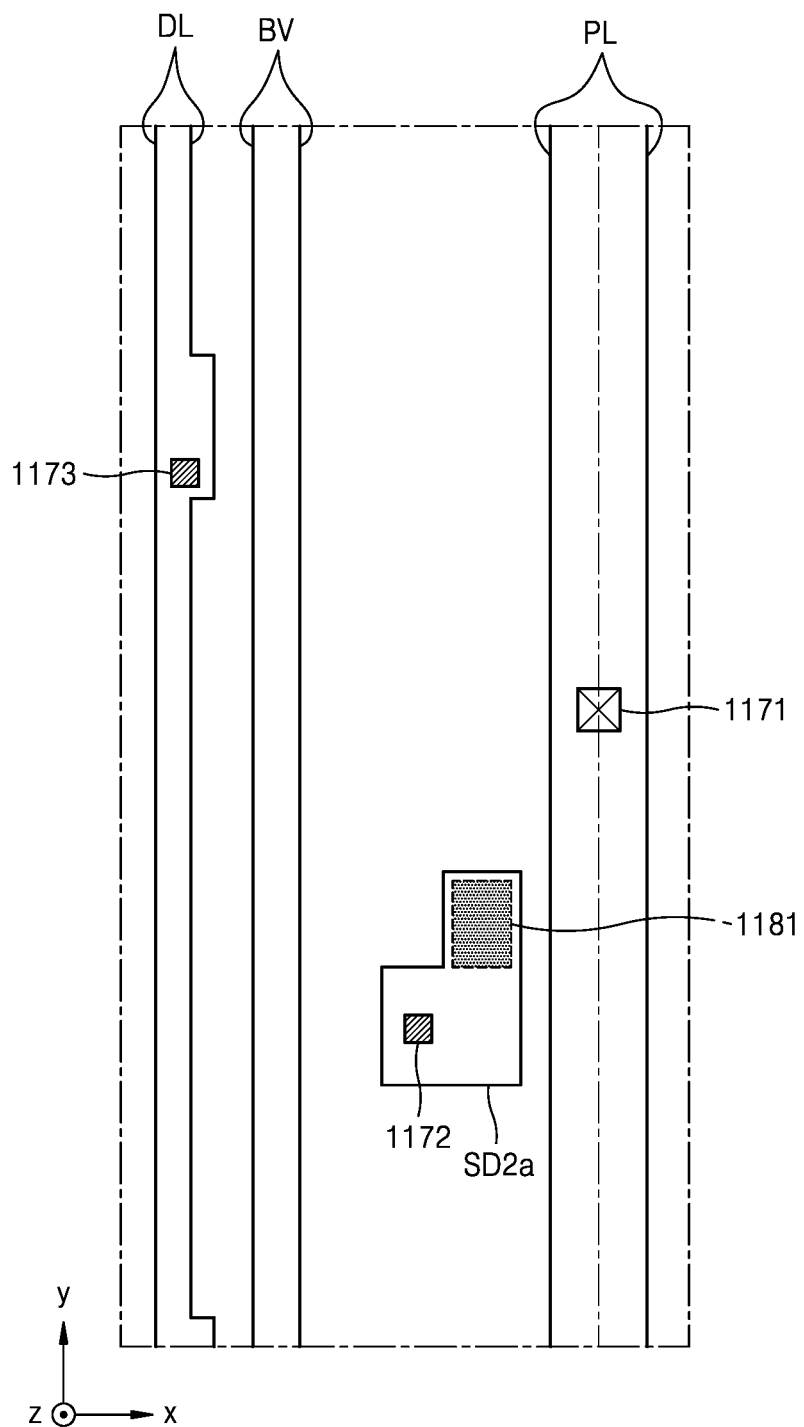
Figure 8:
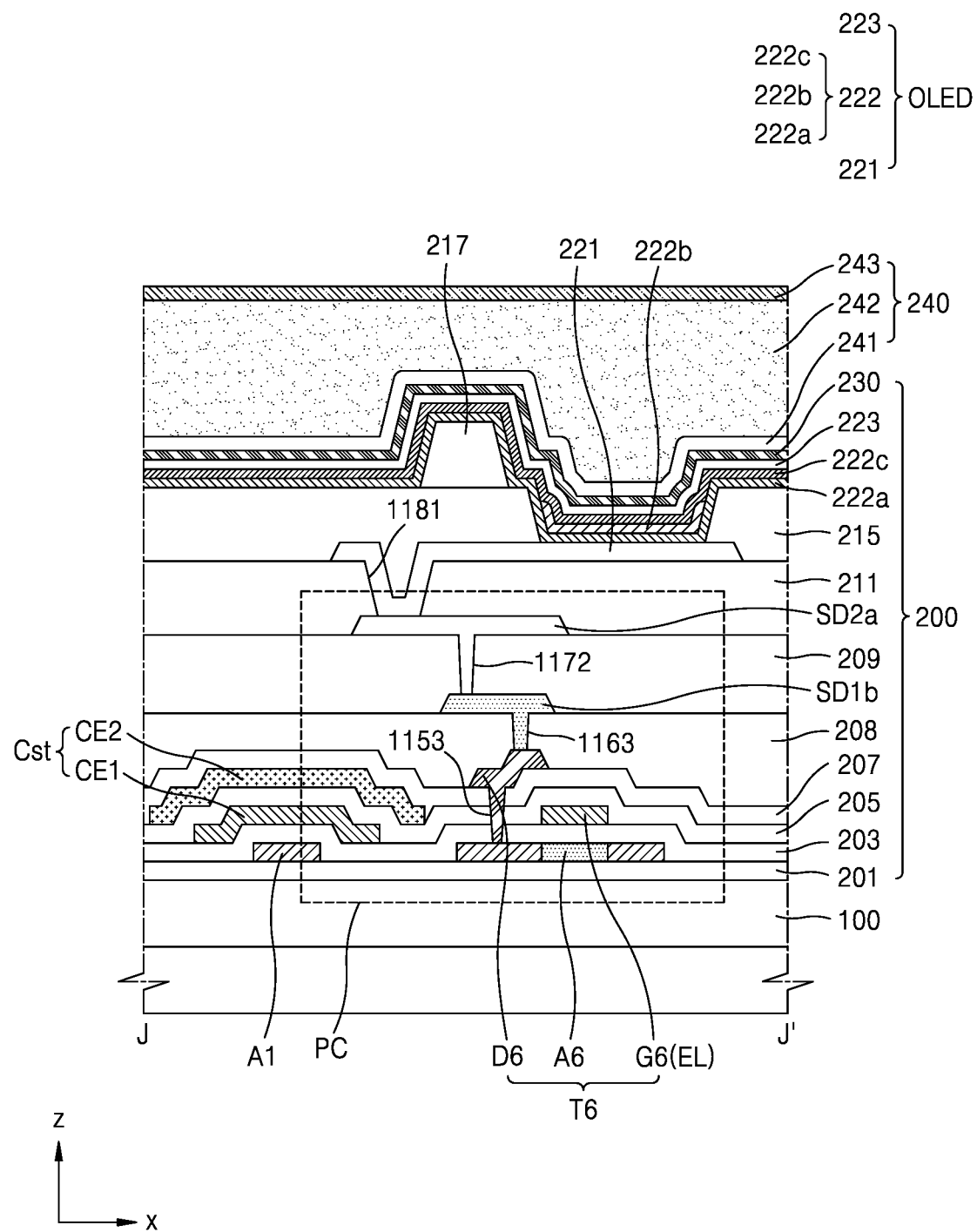
FIG. 8 is a schematic cross-sectional view of a stack structure of a pixel circuit for driving a pixel, the stack structure being taken along line J-J' of FIG. 6.

FIG. 6 is a plan view showing a stack structure of the pixel circuit for driving one or a pixel, according to an embodiment, FIGS. 7A to 7F are plan views showing respective layers in the stack structure of FIG. 6, and FIG. 8 is a schematic cross-sectional view showing the stack structure of the pixel circuit for driving one or a pixel, according to an embodiment. FIG. 8 corresponds to a cross-section taken along line J-J' of FIG. 6.

Each of FIGS. 7A to 7F shows the arrangement of lines, electrodes, semiconductor layers, for example, disposed on the same layer, and insulating layers may be among the layers shown in FIGS. 7A to 7F. For example, at least with respect to the display panel 200, a first gate insulating layer 203 (see FIG. 8) may be disposed between a layer shown in FIG. 7A and a layer shown in FIG. 7B, a second gate insulating layer 205 (see FIG. 8) may be disposed between the layer shown in FIG. 7B and a layer shown in FIG. 7C, a first interlayer insulating layer 207 (see FIG. 8) may be disposed between the layer of FIG. 7C and a layer shown in FIG. 7D, and a second interlayer insulating layer 208 (see FIG. 8) may be disposed between the layer of FIG. 7D and a layer shown in FIG. 7E. A first planarization layer 209 (see FIG. 8) may be disposed between the layer of FIG. 7E and a layer shown in FIG. 7F, and a second planarization layer 211 (see FIG. 8) may be disposed between the layer of FIG. 7F and a pixel electrode 221 (see FIG. 8). The layers shown in FIGS. 7A to 7F may be electrically connected to one another via a contact hole defined in at least some or a predetermined number of the above-stated insulating layers.

Referring to FIG. 6, the pixel P may include the pixel circuit PC including the thin film transistors T1 to T7 and the storage capacitor Cst, and the organic light-emitting diode OLED (see FIG. 8) electrically connected to the pixel circuit PC. The pixel P denotes a sub-pixel and may emit, for example, red light, green light, blue light, or white light.

The pixel P may include the scan line SL, the previous scan line SL−1, the post scan line SL+1, the first initialization voltage line VL1, and the second initialization voltage line VL2 that respectively apply the scan signal Sn, the previous scan signal Sn−1, the post scan signal Sn+1, the emission control signal En, and the initialization voltage Vint and extend in a second direction (for example, x-direction) The pixel P may include the data line DL and the driving voltage line PL that extend in the first direction (for example, y-direction) so as to cross the scan line SL, the previous scan line SL−1, the post scan line SL+1, the first initialization voltage line VL1, and the second initialization voltage line VL2 and respectively apply the data signal Dm and the driving voltage ELVDD. The pixel P also may include a conductive layer SDL for preventing or reducing generation of a parasitic capacitance.

Moreover, the pixel P according to an embodiment may include a first connecting line BV extending in the first direction (for example, y-direction) and a second connecting line BH extending in the second direction (for example, x-direction). The first connecting line BV and the second connecting line BH may be electrically connected to each other to obtain the connecting wire BL as shown in FIGS. 4A to 4C.

In an embodiment, the first connecting line BV and the second connecting line BH may be disposed on different layers and may be electrically connected to each other via a contact hole. As described above, because the first connecting line BV and the second connecting line BH included in the connecting wire BL may be disposed on different layers, high speed driving (for example, 120 Hz or greater) of the pixels P in a region of the display area DA (for example, the first areas DA1) may be effectively implemented, and display quality may be improved.

Hereinafter, the description will be provided according to a stacking order for convenience of description. FIG. 8 shows a cross-section taken along line J-J' of FIG. 6.

Referring to FIGS. 6, 7A to 7F, and 8, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be arranged or disposed along a semiconductor layer 1130, and some or a predetermined number regions in the semiconductor layer 1130 may correspond to semiconductor layers A1 to A7 of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7.

The semiconductor layer 1130 of FIG. 7A may be disposed on the substrate 100. In an embodiment, a buffer layer 201 may be disposed on the substrate 100, and the semiconductor layer 1130 may be disposed on the buffer layer 201.

The substrate 100 may include glass or a polymer resin. The substrate 100 including the polymer resin may be flexible, rollable, or bendable. The substrate 100 may have a multi-layered structure including a layer including the polymer resin stated above and an inorganic layer (not shown).

The buffer layer 201 may reduce or prevent infiltration of impurities, moisture, or external air from below the substrate 100, and may provide a planarized surface on the substrate 100. The buffer layer 201 may include an inorganic material such as an oxide material or a nitride material, an organic material, or an inorganic-organic composite material, and may have a single-layered or multi-layered structure including the inorganic material and the organic material. For example, the buffer layer 201 may have a structure, in which buffer layers may be stacked, and the buffer layers may have different materials from one another. For example, one of the buffer layers may include silicon nitride, for example, $SiN_X$. Another buffer layer of the buffer layers may include silicon oxide, for example, $SiO_X$.

The semiconductor layer 1130 may include low temperature polysilicon (LTPS). Because a polysilicon material may have a high electron mobility (about 100 $cm^2$/Vs or greater), low energy consumption and excellent reliability may be exhibited. In another example, the semiconductor layer 1130 may include amorphous silicon (a-Si) and/or an oxide semiconductor, and some or a predetermined number semiconductor layers in the thin film transistors may include low temperature polysilicon (LTPS) and the other semiconductor layers may include amorphous silicon (a-Si) and/or an oxide semiconductor.

The semiconductor layers A1 to A7 may include channel regions ca1 to ca7, source regions and drain regions at opposite sides of the channel regions ca1 to ca7. In an example, the source region and the drain region may be doped with impurities, and the impurities may include N-type impurities or P-type impurities. The source regions and the drain regions may be respectively electrically connected to the source electrodes S1 to S7 and the drain electrodes D1 to D7, and may correspond to the source electrodes S1 to S7 and the drain electrodes D1 to D7 themselves. Hereinafter, terms such as the source electrodes S1 to S7 and the drain electrodes D1 to D7 will be used instead of the terms source region and drain region.

Referring to FIGS. 7A and 8, the first gate insulating layer 203 may be disposed on the semiconductor layer 1130 (for example, the driving semiconductor layer A1 and the emission control semiconductor layer A6 of FIG. 8). The first gate insulating layer 203 may include an inorganic material including an oxide material or a nitride material. For example, the first gate insulating layer 203 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The first electrode layer CE1, the scan line SL, the previous scan line SL−1, the post scan line SL+1, and the emission control line EL of FIG. 7B may be on the first gate insulating layer 203. For example, the first electrode layer CE1, the scan line SL, the previous scan line SL−1, the post scan line SL+1, and the emission control line EL may each have a single-layered or multi-layered structure including at least one selected from molybdenum (Mo), aluminum (Al), copper (Cu), and titanium (Ti).

The first electrode layer CE1 may correspond to the driving gate electrode G1 of the driving thin film transistor T1, and some or a predetermined number of parts of the scan line SL, the previous scan line SL−1, the post scan line SL+1, and the emission control line EL may correspond to gate electrodes G2 to G7 of the thin film transistors T2 to T7. For example, overlapping portions between the scan line SL, the previous scan line SL−1, the post scan line SL+1, and the emission control line EL and the semiconductor layer 1130 may be defined as the gate electrodes G2 to G7.

In detail, in the scan line SL, regions overlapping the channel regions ca2 and ca3 of the switching and compensation thin film transistors T2 and T3 may respectively correspond to switching and compensation gate electrodes G2 and G3, in the previous scan line SL−1, a region overlapping the channel region ca4 of the first initialization thin film transistor T4 corresponds to a first initialization gate electrode G4, in the post scan line SL+1, a region overlapping the channel region ca7 of the second initialization thin film transistor T7 corresponds to a second initialization gate electrode G7, and in the emission control line EL, regions overlapping the channel regions ca5 and ca6 of the operation control and emission control thin film transistors T5 and T6 may respectively correspond to operation control and emission control gate electrodes G5 and G6.

In an embodiment, the compensation gate electrode G3 and the first initialization gate electrode G4 may be dual-gate electrodes which may prevent or reduce generation of a leakage current.

In the first electrode layer CE1, a portion overlapping the driving channel region ca1 corresponds to the driving gate electrode G1. The first electrode layer CE1 may simultaneously act as the driving gate electrode and a first storage capacitor plate of the storage capacitor Cst. For example, it may be understood that the driving gate electrode G1 and the first storage capacitor plate may be integrally provided.

Referring to FIGS. 7B and 8, the second gate insulating layer 205 is on the driving gate electrode G1, the scan line SL, the previous scan line SL−1, the post scan line SL+1, and the emission control line EL. The second gate insulating layer 205 may include an inorganic material including an oxide material or a nitride material. For example, the second gate insulating layer 205 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

An electrode voltage line HL of FIG. 7C is on the second gate insulating layer 205. The electrode voltage line HL may include a second electrode layer CE2 extending in one direction (for example, +y direction). The second electrode layer CE2 may overlap the first electrode layer CE1. Therefore, the second electrode layer CE2 may be used as a second storage capacitor plate of the storage capacitor Cst. Therefore, the second gate insulating layer 205 may act as a dielectric layer of the storage capacitor Cst.

An opening HL-OP may be in the second electrode layer CE2, and an end portion of a node connecting line N of FIG. 7D may be electrically connected to the first electrode layer CE1 via the opening HL-OP. For example, the electrode voltage line HL may have a single-layered or multi-layered structure including molybdenum (Mo), aluminum (Al), copper (Cu), titanium (Ti), for example.

Referring to FIGS. 7C and 8, the first interlayer insulating layer 207 is on the electrode voltage line HL. The first interlayer insulating layer 207 may include an inorganic material including an oxide material or a nitride material. For example, the first interlayer insulating layer 207 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), for example.

The node connecting line N, the first initialization voltage line VL1, the second initialization voltage line VL2, and first to third contact metals GM3a, GM3b, and GM3c of FIG. 7D may be disposed on the first interlayer insulating layer 207. The node connecting line N, the first initialization voltage line VL1, the second initialization voltage line VL2, and the first to third contact metals GM3a, GM3b, and GM3c have the same or similar material as one another. For example, the node connecting line N, the first initialization voltage line VL1, the second initialization voltage line VL2, and the first to third contact metals GM3a, GM3b, and GM3c may each have a single-layered or multi-layered structure including molybdenum (Mo), aluminum (Al), copper (Cu), titanium (Ti), for example.

The node connecting line N, the first initialization voltage line VL1, the second initialization voltage line VL2, and the first to third contact metals GM3a, GM3b, and GM3c may each be in electrical contact with a part of the semiconductor layer 1130 via contact holes 1151, 1152, 1153, 1154, 1155, and 1156, respectively. The first initialization voltage line VL1 and the second initialization voltage line VL2 may to transfer initialization voltages to the first initialization thin film transistor T4 and the second initialization thin film transistor T7 via the contact holes 1151 and 1152. The node connecting line N may electrically connect the driving gate electrode G1 to the drain electrode D3 of the compensation thin film transistor T3 via contact holes 1156 and 1157. An end of the node connecting line N may be electrically connected to the drain electrode D3 of the compensation thin film transistor T3 via the contact hole 1156, and an opposite end of the node connecting line N may be electrically connected to the driving gate electrode G1 via the contact hole 1157.

Referring to FIGS. 7D and 8, the second interlayer insulating layer 208 is on the node connecting line N, the first initialization voltage line VL1, the second initialization voltage line VL2, and the first to third contact metals GM3a, GM3b, and GM3c. The second interlayer insulating layer 208 may include an inorganic material including an oxide material or a nitride material. For example, the second interlayer insulating layer 208 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), for example.

The conductive layer SDL, the second connecting line BH, and fourth and fifth contact metals SD1a and SD1b of FIG. 7E may be disposed on the second interlayer insulating layer 208. The conductive layer SDL, the second connecting line BH, and the fourth and fifth contact metals SD1a and SD1b include the same or similar material as one another. For example, the conductive layer SDL, the second connecting line BH, and the fourth and fifth contact metals SD1a and SD1b may each have a single-layered or multi-layered structure including molybdenum (Mo), aluminum (Al), copper (Cu), titanium (Ti), for example. In detail, the conductive layer SDL, the second connecting line BH, and the fourth and fifth contact metals SD1a and SD1b may each have a multi-layered structure including Ti/Al/Ti.

The conductive layer SDL may be electrically connected to the second contact metal GM3b via a contact hole 1161 and to the second electrode layer CE2 via a contact hole 1164. Also, the fourth and fifth contact metals SD1a and SD1b may be electrically connected to the first and third contact metals GM3a and GM3c thereunder via contact holes 1162 and 1163, respectively.

The conductive layer SDL may overlap the node connecting line N thereunder. For example, the conductive layer SDL may shield the node connecting line N from above the node connecting line N. The data line DL, the driving voltage line PL, and the first connecting line BV that will be described later may be on the conductive layer SDL, and some or a predetermined number of the data line DL, the driving voltage line PL, and the first connecting line BV may at least partially overlap or may be adjacent to the node connecting line N such that a parasitic capacitance may be generated therebetween. Therefore, the conductive layer SDL may completely overlap the node connecting line N according to an embodiment, and thus, generation of the parasitic capacitance between the node connecting line N and the data line DL, the driving voltage line PL, and the first connecting line BV may be prevented or reduced.

The second connecting line BH is a part of the connecting wire BL shown in FIG. 4A or FIG. 4C and may extend in the second direction (for example, x-direction). An end of the second connecting line BH may be electrically connected to the first connecting line BV and an opposite end of the second connecting line BH may be directly or indirectly electrically connected to the data line DL.

Referring to FIG. 8, the first planarization layer 209 may be disposed on the conductive layer SDL, the second connecting line BH, and the fourth and fifth contact metals SD1a and SD1b. The first planarization layer 209 may include an organic material.

The data line DL, the driving voltage line PL, the first connecting line BV, and the sixth contact metal SD2a of FIG. 7F may be disposed on the first planarization layer 209. The data line DL, the driving voltage line PL, the first connecting line BV, and the sixth contact metal SD2a include the same or similar material as one another. For example, the data line DL, the driving voltage line PL, the first connecting line BV, and the sixth contact metal SD2a may have a single-layered or multi-layered structure including molybdenum (Mo), aluminum (Al), copper (Cu), titanium (Ti), for example. In detail, the data line DL, the driving voltage line PL, the first connecting line BV, and the sixth contact metal SD2a may each have a multi-layered structure including Ti/Al/Ti.

The data line DL may be electrically connected to the fourth contact metal SD1a via a contact hole 1173 to be electrically connected to the switching thin film transistor T2.

The driving voltage line PL may be shared by two adjacent pixels P. In FIG. 6, the two adjacent pixels P may be symmetrical with each other, for example, a flip structure is shown, and thus, the two adjacent pixels P may share the driving voltage line PL. The driving voltage line PL is at a center between the two adjacent pixels P and may be electrically connected to the conductive layer SDL via a contact hole 1171. Therefore, a driving voltage that may be the same as that of the driving voltage line PL may be applied to the conductive layer SDL. The driving voltage applied through the driving voltage line PL may be electrically connected to the operation control thin film transistor T5 via the conductive layer SDL and the second contact metal GM3b.

The sixth contact metal SD2a may be electrically connected to the fifth contact metal SD1b thereunder via the contact hole 1172 defined in the first planarization layer 209 to be electrically connected to the emission control thin film transistor T6, and may be electrically connected to a pixel electrode 221 thereon via a contact hole 1181 defined in the second planarization layer 211.

The first connecting line BV is a part of the connecting wire BL shown in FIG. 4A or FIG. 4C and may extend in the first direction (for example, y-direction). An end of the first connecting line BV may be electrically connected to the second connecting line BH and an opposite end of the first connecting line BV may be electrically connected to the first input line IL1 in the second peripheral area PA2.

Referring to FIG. 8, the second planarization layer 211 may be disposed on the data line DL, the driving voltage line PL, the first connecting line BV, and the sixth contact metal SD2a. For example, the first planarization layer 209 and the second planarization layer 211 may each include an organic insulating material such as a general universal polymer (polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In an embodiment, the first planarization layer 209 and the second planarization layer 211 may include polyimide.

The pixel electrode 221 may be on the second planarization layer 211. The pixel electrode 221 may include a conductive oxide such as indium tin oxide (ITO), indium zinc oxide (IZO), zinc oxide (ZnO), indium oxide ($In_2O_3$), indium gallium oxide, or aluminum zinc oxide (AZO). In another embodiment, the pixel electrode 221 may include a reflective layer including argentum (Ag), magnesium (Mg), aluminum (Al), platinum (Pt), palladium (Pd), aurum (Au), nickel (Ni), neodymium (Nd), iridium (Ir), chrome (Cr), or a compound thereof. In another embodiment, the pixel electrode 221 may include a layer including ITO, IZO, ZnO, or $In_2O_3$ on and/or under or below the reflective layer.

A pixel defining layer 215 may be on the pixel electrode 221. The pixel defining layer 215 may include an opening exposing an upper surface of the pixel electrode 221, but may cover or overlap edges of the pixel electrode 221. The pixel defining layer 215 may include an organic insulating material. Alternatively, the pixel defining layer 215 may include an inorganic insulating material such as silicon nitride ($SiN_x$), silicon oxynitride (SiON), or silicon oxide ($SiO_x$). Alternatively, the pixel defining layer 215 may include an organic insulating material and an inorganic insulating material.

An intermediate layer 222 may include an emission layer 222b. The intermediate layer 222 may include a first functional layer 222a under or below the emission layer 222b and/or a second functional layer 222c disposed on the emission layer 222b. The emission layer 222b may include a polymer or low-molecular weight organic material emitting predetermined color light.

The first functional layer 222a may have a single-layered or multi-layered structure. For example, in a case that the first functional layer 222a may include a polymer material, the first functional layer 222a may include a hole transport layer (HTL) having a single-layered structure, and may include poly-(3,4)-ethylene-dihydroxy thiophene (PEDOT) or polyaniline (PANI). In a case that the first functional layer 222a may include a low-molecular weight organic material, the first functional layer 222a may include a hole injection layer (HIL) and an HTL.

The second functional layer 222c may be omitted. For example, in a case that the first functional layer 222a and the emission layer 222b include a polymer material, the second functional layer 222c may be formed. The second functional layer 222c may have a single-layered or multi-layered structure. The second functional layer 222c may include an electron transport layer (ETL) and/or an electron injection layer (EIL).

The emission layer 222b of the intermediate layer 222 may be in every pixel of the display area DA. The emission layer 222b may be patterned to correspond to the pixel electrode 221. Different from the emission layer 222b, the first functional layer 222a and/or the second functional layer 222c in the intermediate layer 222 may be integrally provided or disposed on the display area DA.

The opposite electrode 223 may include a conductive material having a low work function. For example, the opposite electrode 223 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 223 may include a layer including ITO, IZO, ZnO, or $In_2O_3$ on the (semi-)transparent layer including the above material. The opposite electrode 223 may be provided or disposed on the display area DA. The first functional layer 222a, the second functional layer 222c, and the opposite electrode 223 may be manufactured by a thermal evaporation method.

A capping layer 230 may be on the opposite electrode 223. For example, the capping layer 230 may include LiF and may be formed by a thermal evaporation method. In an alternative embodiment, the capping layer 230 may be omitted.

A spacer 217 may be formed on the pixel defining layer 215. The spacer 217 may include an organic insulating material such as polyimide. Alternatively, the spacer 217 may include an inorganic insulating material, or an organic insulating material and an inorganic insulating material.

The spacer 217 may include a material that may be different from or the same as that of the pixel defining layer 215. For example, the pixel defining layer 215 and the spacer 217 may be manufactured together through a mask process using a half-tone mask. In an embodiment, the pixel defining layer 215 and the spacer 217 may include polyimide.

The organic light-emitting diode OLED may be covered or overlapped by an encapsulation member. In FIG. 8, the organic light-emitting diode OLED may be covered or overlapped by an encapsulation member such as a thin film encapsulation layer 240, but one or more embodiments are not limited thereto. In an embodiment, the organic light-emitting diode OLED may be shielded against external air by an encapsulation member such as an upper substrate (not shown) or frit (not shown).

The thin film encapsulation layer 240 may include at least one organic encapsulation layer and at least one inorganic encapsulation layer, and FIG. 8 shows that the thin film encapsulation layer 240 may include first and second inorganic encapsulation layers 241 and 243 and an organic encapsulation layer 242 disposed between the first and second inorganic encapsulation layers 241 and 243. In another embodiment, a stacking order and the number of organic and inorganic encapsulation layers may vary.

The first and second inorganic encapsulation layers 241 and 243 may include one or more inorganic materials from aluminum oxide, titanium oxide, tantalum oxide, hafnium oxide, zinc oxide, silicon oxide, silicon nitride, and silicon oxynitride. The first inorganic encapsulation layer 241 and the second inorganic encapsulation layer 243 may each have a single-layered structure or a multi-layered structure including the above-mentioned materials.

The organic encapsulation layer 242 may include a monomer-based material or a polymer-based material. The polymer-based material may include an acryl-based resin, an epoxy-based resin, polyimide, polyethylene, for example. In an embodiment, the organic encapsulation layer 242 may include acrylate.

The first inorganic encapsulation layer 241 and the second inorganic encapsulation layer 243 may have different thicknesses. The thickness of the first inorganic encapsulation layer 241 may be greater than that of the second inorganic encapsulation layer 243. Alternatively, the thickness of the second inorganic encapsulation layer 243 may be greater than that of the first inorganic encapsulation layer 241, or the first inorganic encapsulation layer 241 and the second inorganic encapsulation layer 243 may have the same thickness.

Figure 9:
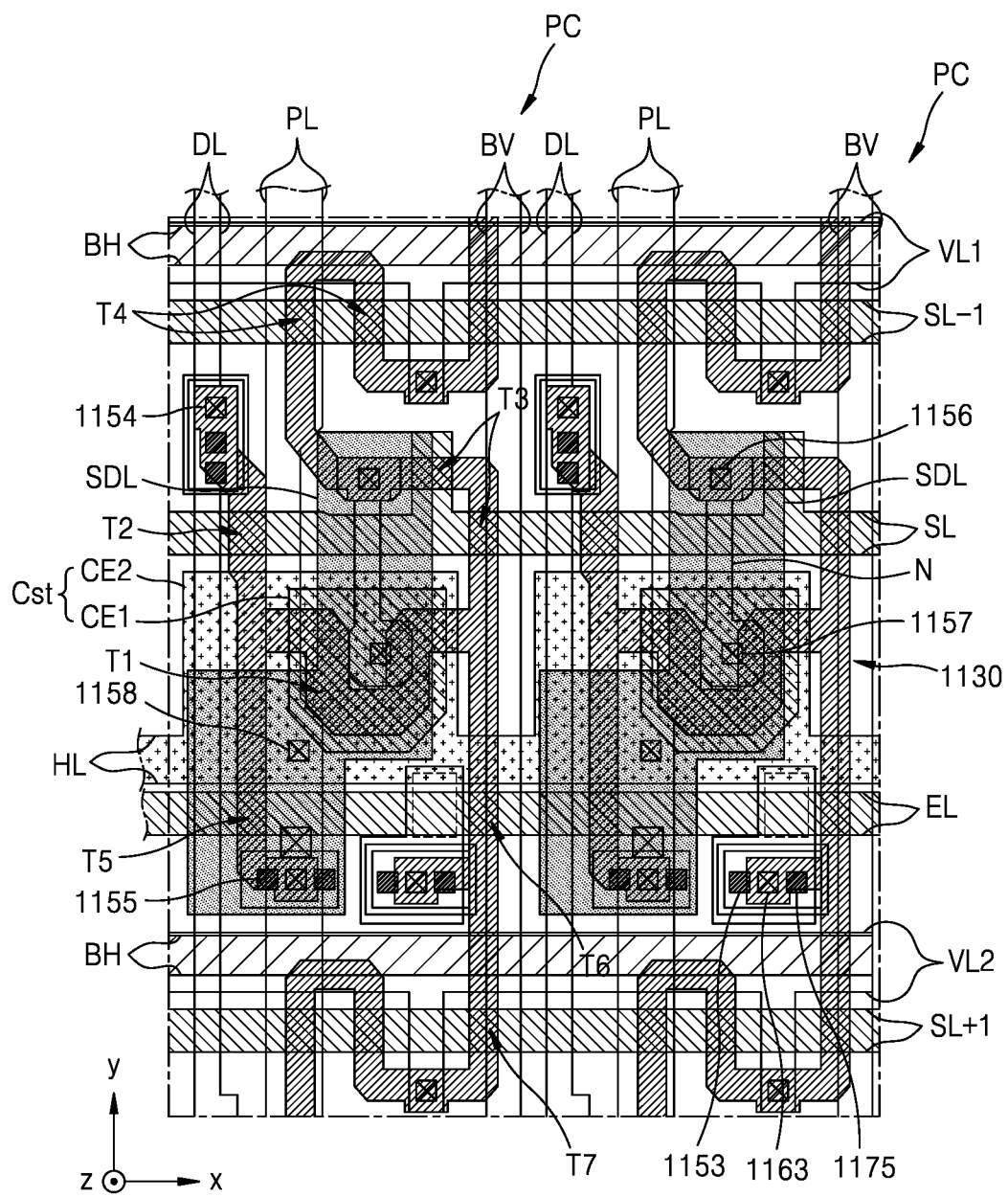
FIG. 9 is a diagram showing a modified example of an arrangement of a pixel circuit.

FIG. 9 shows a modified example of a stack structure in a pixel circuit.

In FIG. 6, as described above, the flip structure in which two adjacent pixels P may be symmetrical with each other is shown, but FIG. 9 may have a non-flip structure in which the pixel P having the same structure may be repeatedly arranged or disposed. Therefore, in an embodiment shown in FIG. 9, the driving voltage line PL may be provided in each pixel P. Electrical connecting structure including the thin film transistors T1 to T7 and the storage capacitor Cst in each pixel P is the same as that of the pixel P shown in FIG. 6. In FIGS. 6 and 9, like reference numerals denote the same elements. Therefore, descriptions about FIG. 6 may be also applied to FIG. 9, and thus redundant descriptions will be omitted.

Figure 10:
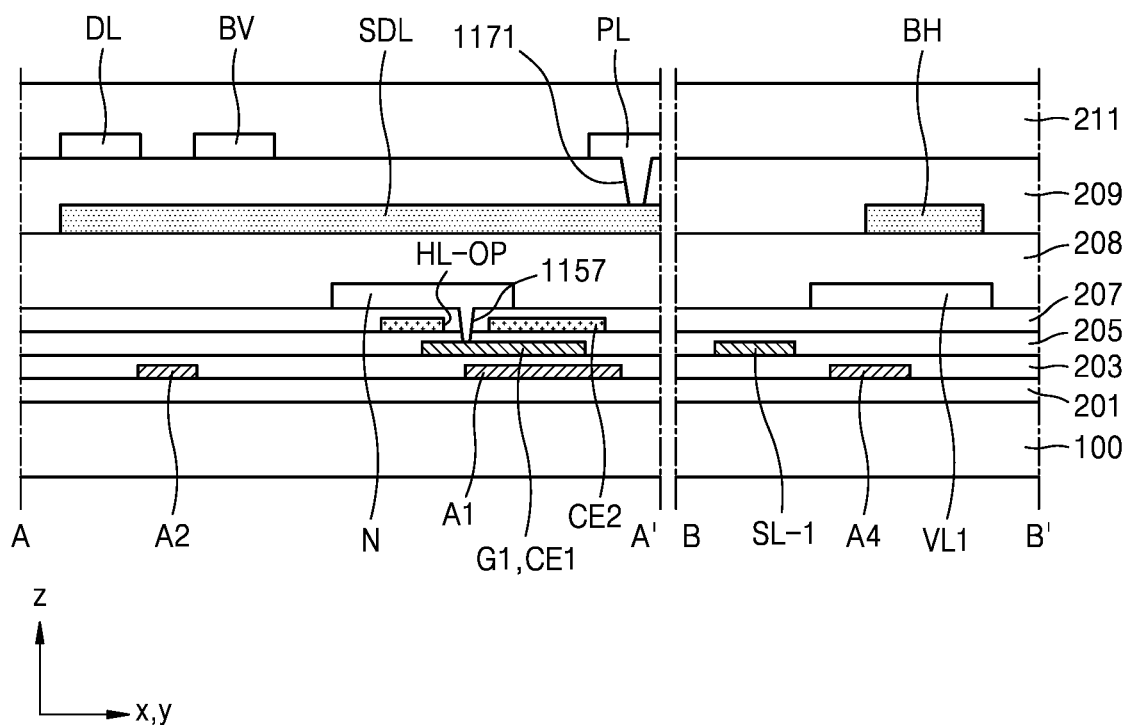
FIG. 10 is a schematic cross-sectional view taken along line A-A' and line B-B' of FIG. 6.

FIG. 10 is a schematic cross-sectional view showing a portion of a display apparatus according to an embodiment. FIG. 10 corresponds to a cross-section taken along line A-A' and line B-B' of FIG. 6.

Referring to FIG. 10, the previous scan line SL−1, the node connecting line N, the first initialization voltage line VL1, the conductive layer SDL, the first connecting line BV, the second connecting line BH, the data line DL, and the driving voltage line PL may be disposed on the substrate 100. Also, in FIG. 10, the driving semiconductor layer A1, the switching semiconductor layer A2, the first initialization semiconductor layer A4, the driving gate electrode G1 (or the first electrode layer CE1), and the second electrode layer CE2 may be disposed on the substrate 100.

The conductive layer SDL may be disposed on the node connecting line N with the second interlayer insulating layer 208 disposed therebetween. As described above, the conductive layer SDL may be electrically connected to the driving voltage line PL via the contact hole 1171 such that a driving voltage is applied thereto.

In a case that projecting from a direction perpendicular to the substrate 100, the node connecting line N may completely overlap the conductive layer SDL. The data line DL, the first connecting line BV, and the driving voltage line PL may be disposed on the conductive layer SDL with the first planarization layer 209 disposed therebetween. As shown in FIG. 10, the data line DL, the first connecting line BV, and the driving voltage line PL may be disposed at the same layer. For example, the conductive layer SDL may be arranged or disposed to entirely shield the node connecting line N above the node connecting line N, and thus, generation of a parasitic capacitance between the data line DL, the first connecting line BV, and the driving voltage line PL above the conductive layer SDL and the node connecting line N under or below the conductive layer SDL may be reduced or removed to effectively prevent quality degradation.

The second connecting line BH may be disposed on the second interlayer insulating layer 208 and may be at the same layer as that of the conductive layer SDL. The first initialization voltage line VL1 is on the first interlayer insulating layer 207 and may at least partially overlap the second connecting line BH. In an embodiment, the second connecting line BH completely overlaps the first initialization voltage line VL1. Therefore, based on the first initialization voltage line VL1, the previous scan line SL−1 may be disposed under or below the first initialization voltage line VL1 and the second connecting line BH is above the first initialization voltage line VL1, and thus, the parasitic capacitance that may occur between the previous scan line SL−1 and the second connecting line BH may be removed or reduced.

Figure 11:
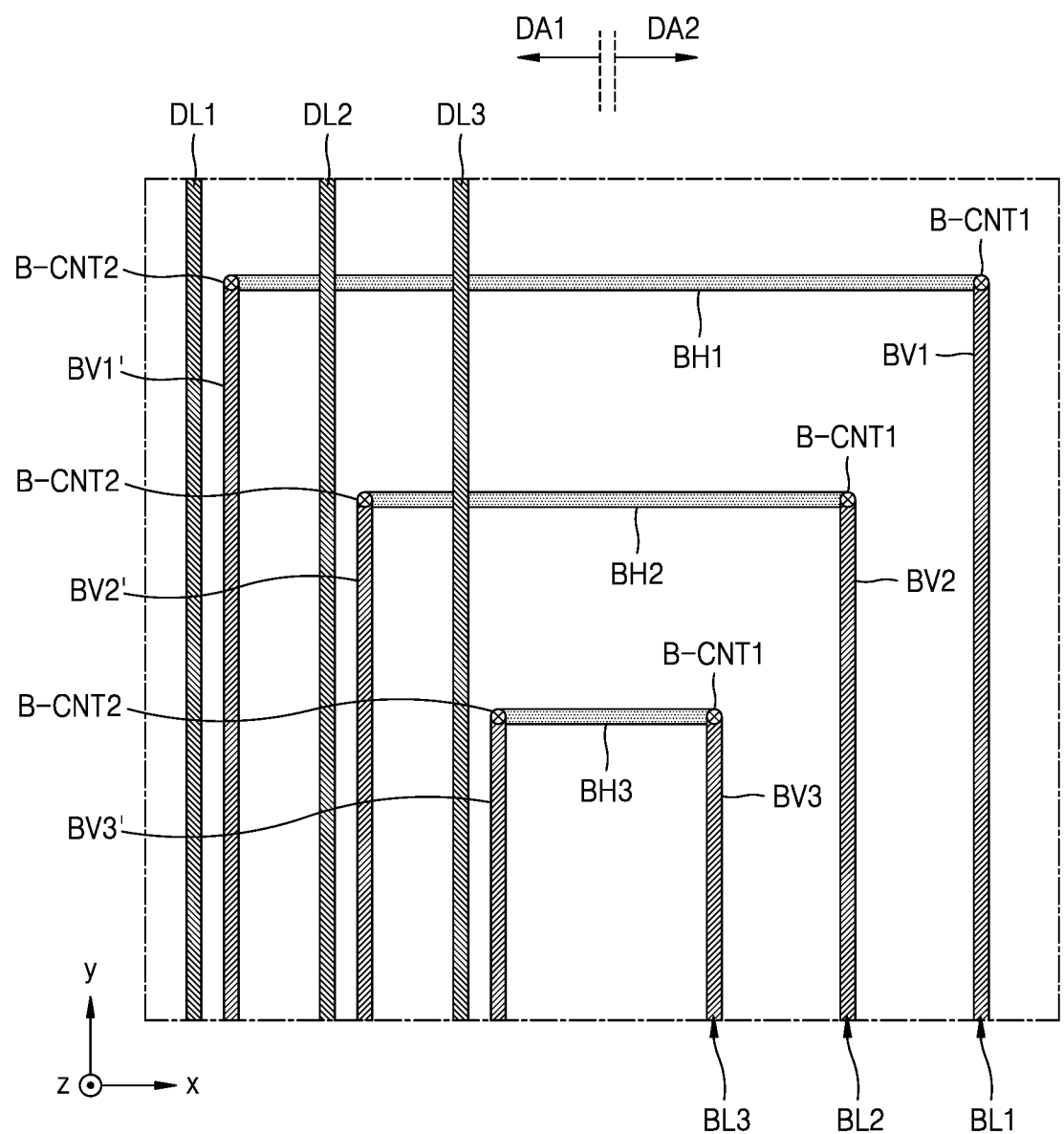
FIG. 11 is a conceptual diagram showing a portion or region of a display area, in which connecting wires are arranged or disposed, in a display apparatus according to an embodiment.
Figure 12:
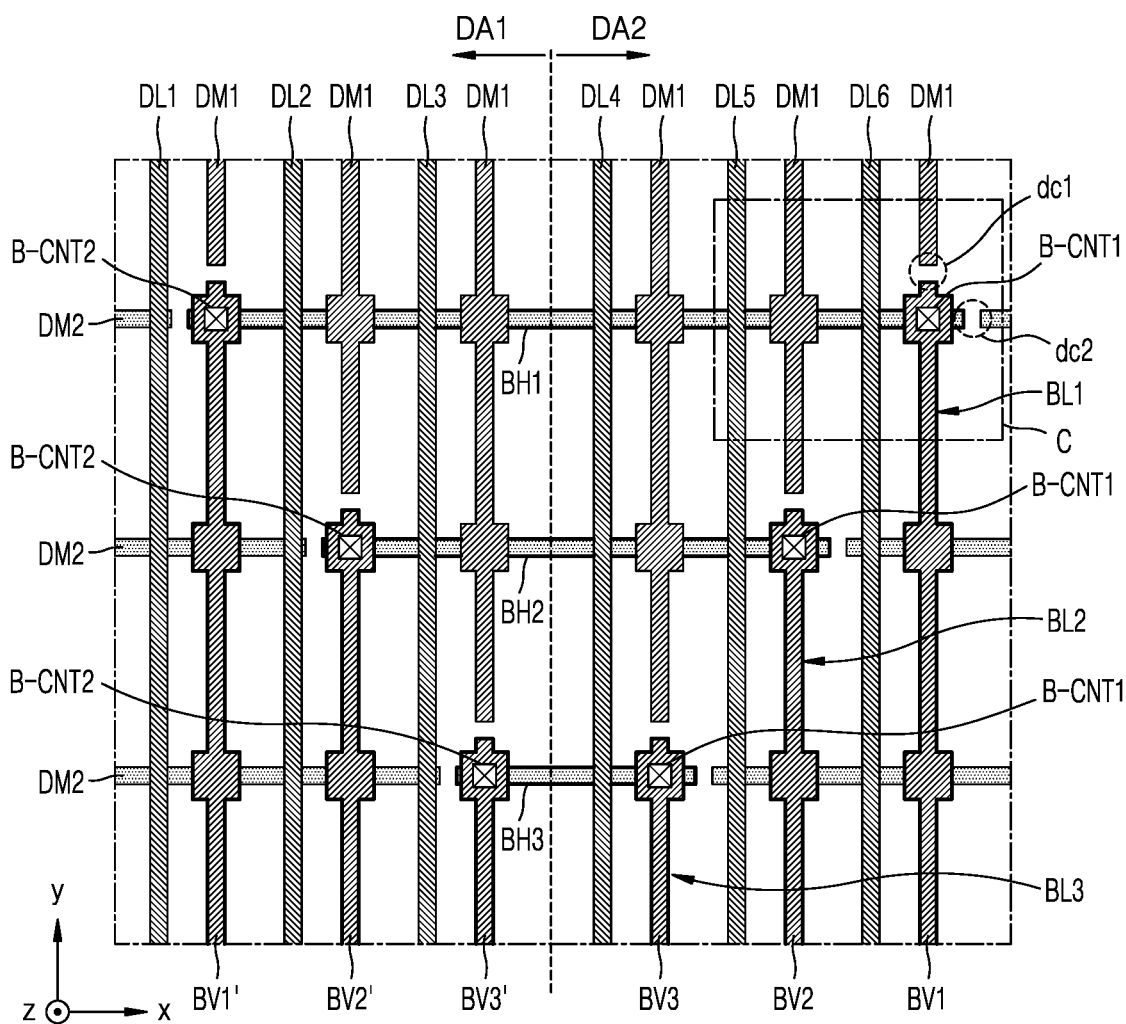
FIG. 12 is a plan view showing the display area of FIG. 11.
Figure 13:
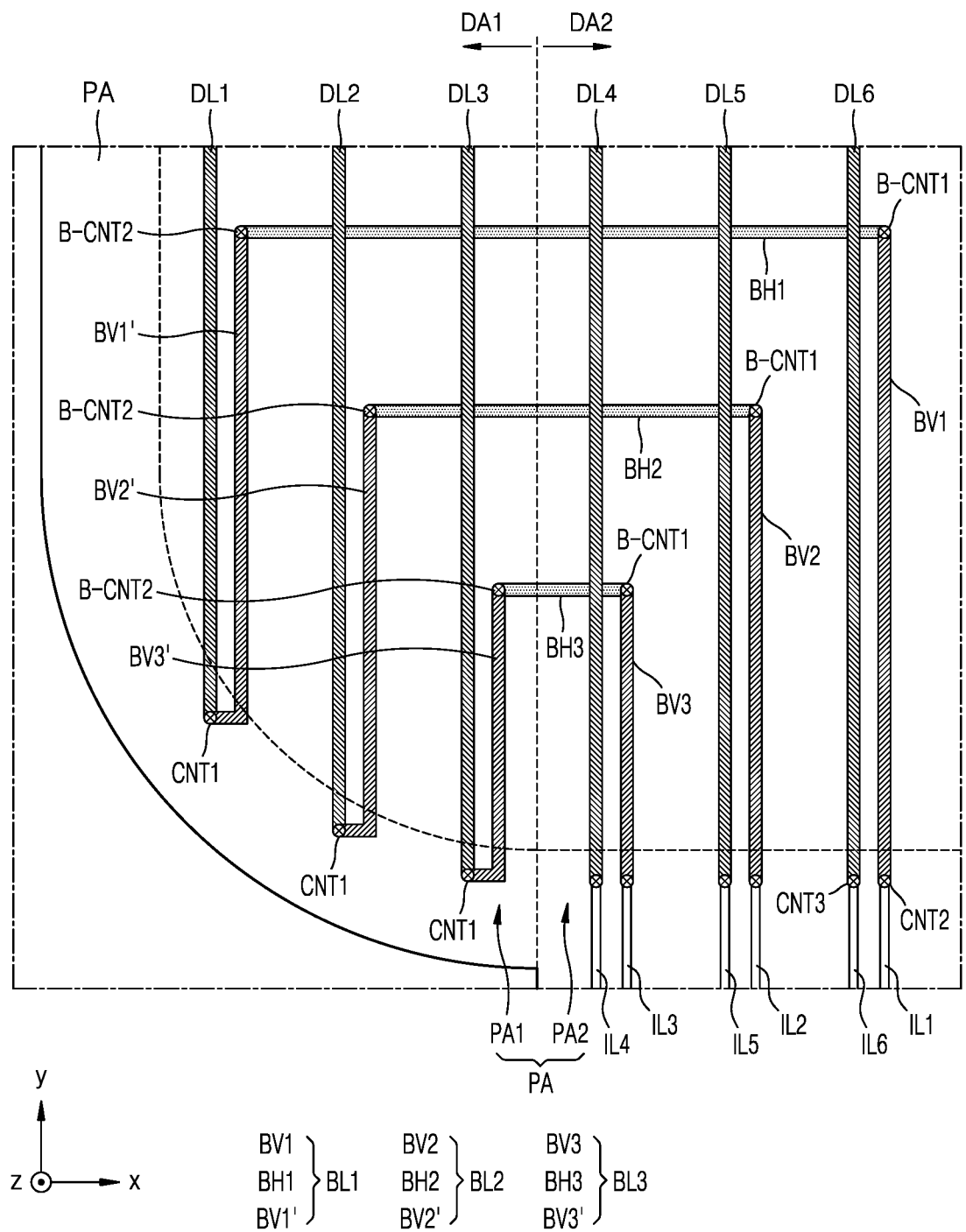
FIG. 13 is a conceptual diagram showing a connecting relationship in a display area in which a connecting wire is arranged or disposed, in a display apparatus according to an embodiment.
Figure 14:
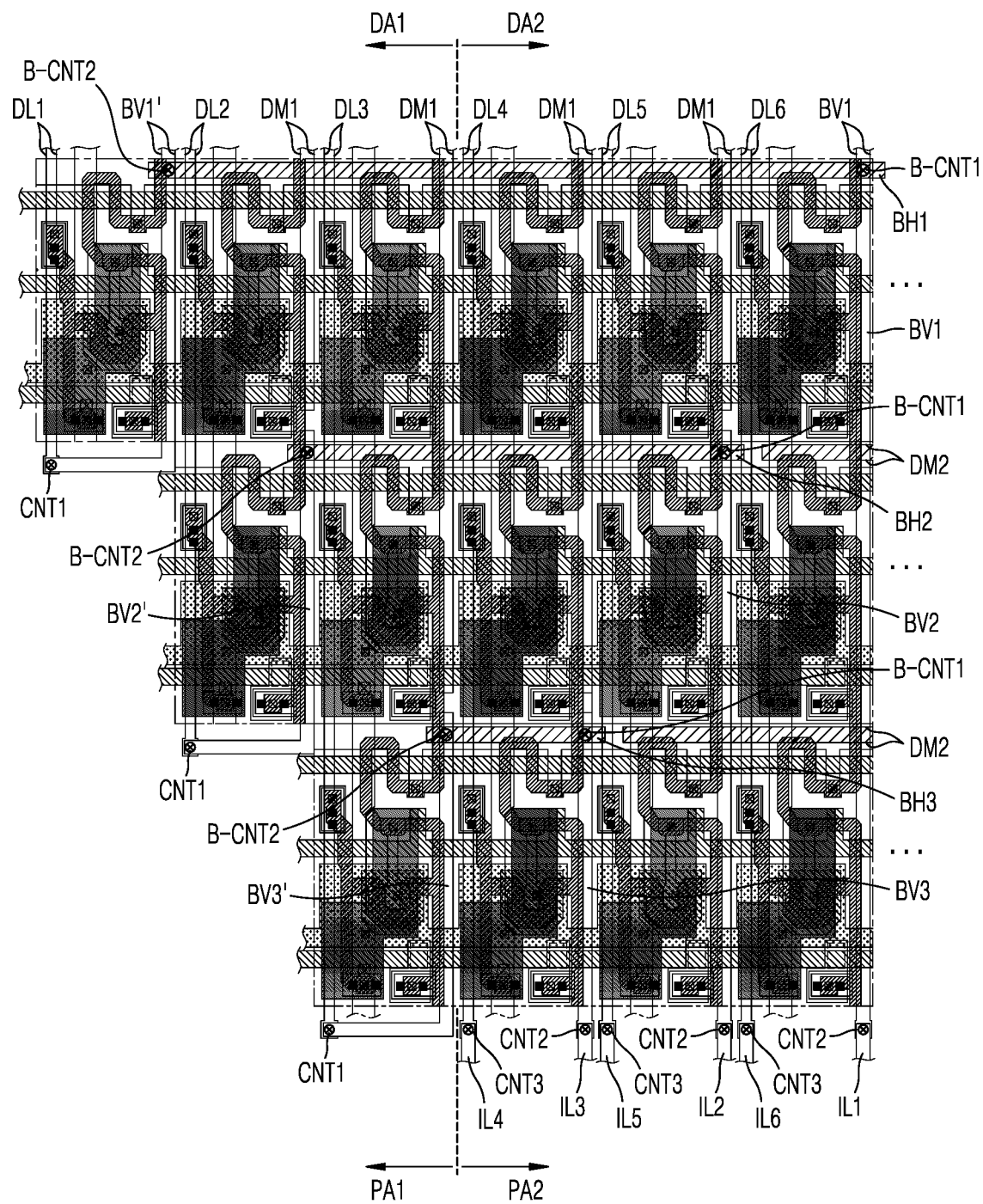
FIG. 14 is a layout of pixels showing FIG. 13.

FIG. 11 is a conceptual diagram showing a portion of a display area, in which a connecting wire may be arranged or disposed, in a display apparatus according to an embodiment, and FIG. 12 is a plan view showing of FIG. 11 in more detail. FIG. 13 is a conceptual diagram showing a connecting relationship on an outer portion of a display area, in which connecting wires of the display apparatus may be arranged or disposed, and FIG. 14 is a layout of pixels of FIG. 13.

Referring to FIG. 11, the first to third data lines DL1 to DL3 may be disposed in the first area DA1, and may extend in the first direction (for example, y-direction). The first to third data lines DL1 to DL3 may be respectively electrically connected to the first to third connecting wires BL1 to BL3 to receive first to third input signals. According to an embodiment, FIG. 11 shows that the first to third data lines DL1 to DL3 may be respectively electrically connected to the first to third connecting wires BL1 to BL3 in the peripheral area PA (for example, first peripheral area PA1) adjacent to the first area DA1. Each of the first to third connecting wires BL1 to BL3 may be bent at least once in order to be respectively electrically connected to the first to third data lines DL1 to DL3. In this case, "bent" shape may denote a shape of wiring via electrical connection, as well as a physical shape.

The first to third connecting wires BL1 to BL3 may extend from the second area DA2 towards the first area DA1. For example, the first to third connecting wires BL1 to BL3 may pass or extend through some or a predetermined number of points of the display area DA over the first area DA1 and the second area DA2.

The first to third connecting wires BL1 to BL3 may respectively include first connecting lines BV1 to BV3 extending in the first direction (for example, y-direction), second connecting lines BH1 to BH3 extending in the second direction (for example, x-direction), and third connecting lines BV1' to BV3' extending in the first direction (for example, y-direction). Here, the first connecting lines BV1 to BV3 may be electrically connected to the second connecting lines BH1 to BH3, the second connecting lines BH1 to BH3 may be electrically connected to the third connecting lines BV1' to BV3', and the third connecting lines BV1' to BV3' may be electrically connected to adjacent first to third data lines DL1 to DL3.

For example, the first connecting wire BL1 may include the first connecting line BV1, the second connecting line BH1, and the third connecting line BV1'. Based on the second connecting line BH1, the first connecting line BV1 may be electrically connected to an end of the second connecting line BH1 and the third connecting line BV1' may be electrically connected to an opposite end of the second connecting line BH1. The above connecting relations may be also applied to the second connecting wire BL2 and the third connecting wire BL3.

At least some or a predetermined number of the second connecting lines BH1 to BH3 extending in the second direction (for example, x-direction) may overlap at least some or a predetermined number of the first to third data lines DL1 to DL3 in the first area DA1. Here, "overlapping" may denote that two layers may be disposed on different layers with an insulating layer disposed therebetween without being electrically connected to each other. For example, the first connecting line BH1 of the first connecting wire BL1 may partially overlap the second data line DL2 and the third data line DL3, and the second connecting line BH2 of the second connecting wire BL2 may partially overlap the third data line DL3.

Referring to FIG. 12, from among the data lines DL1 to DL6, the first to third data lines DL1 to DL3 may be in the first area DA1 and the fourth to sixth data lines DL4 to DL6 may be in the second area DA2. In FIG. 12, the third data line DL3 and the fourth data lines DL4 may be next to each other, but one or more embodiments are not limited thereto. In an embodiment, at least one data line may be provided or disposed between the third data line DL3 and the fourth data line DL4.

The data lines DL1 to DL6, the first connecting lines BV1 to BV3, the second connecting lines BH1 to BH3, and the third connecting lines BV1' to BV3' may be in parallel with one another or may be alternately arranged or disposed. The data lines DL1 to DL6, the first connecting lines BV1 to BV3, and the third connecting lines BV1' to BV3' may be provided in the first direction (for example, y-direction), and the second connecting lines BH1 to BH3 may be provided in the second direction (for example, x-direction). In an embodiment, the data lines DL1 to DL6, the first connecting lines BV1 to BV3, and the third connecting lines BV1' to BV3' may be at the same layer, and the second connecting lines BH1 to BH3 may be at a lower layer.

First dummy lines DM1 may be arranged or disposed continuously on the display area DA in the first direction (for example, y-direction) may be the same as the direction in which the first connecting lines BV1 to BV3 may be arranged or disposed. A first disconnection portion dc1 may be between each of the first dummy lines DM1 and each of the first connecting lines BV1 to BV3. The first dummy lines DM1 may be respectively successive with the first connecting lines BV1 to BV3, but may be disconnected at a certain or predetermined portion to be apart a certain or predetermined gap from the first connecting lines BV1 to BV3.

In an embodiment, the first dummy lines DM1 and the first connecting lines BV1 to BV3 may have a same layered structure. For example, the first dummy lines DM1 and the first connecting lines BV1 to BV3 may include the same or similar material and/or may include the same number of layers. Here, "the same layered structure" may represent that in a case that the first connecting lines BV1 to BV3 each have a triple-layered structure, for example, Ti/Al/Ti, the first dummy lines DM1 may also each have a triple-layered structure of Ti/Al/Ti. For example, the first dummy line DM1 and the first connecting line BV1 may be integrally manufactured through a same process, but the first dummy line DM1 and the first connecting line BV1 may be disconnected to be electrically separated from each other in order to use the first connecting line BV1 as a part of the first connecting wire BL1.

The above structure may also be applied to the first dummy lines DM1 and the third connecting lines BV1' to BV3'.

Similarly, second dummy lines DM2 may be arranged or disposed continuously on the display area DA in the second direction (for example, x-direction) that may be the same as the direction in which the second connecting lines BH1 to BH3 may be arranged or disposed. A second disconnection portion dc2 may be disposed between each of the second dummy lines DM2 and each of the second connecting lines BH1 to BH3. In other words, the second dummy lines DM2 may be respectively successive with the second connecting lines BH1 to BH3, but may be disconnected at a predetermined portion to be apart a predetermined gap from the second connecting lines BH1 to BH3. For example, the second dummy line DM2 and the second connecting line BH1 may be integrally manufactured through a same process, but the second dummy line DM2 and the second connecting line BH1 may be disconnected to be electrically separated from each other in order to use the second connecting line BH1 as a part of the first connecting wire BL1. Also, the second dummy lines DM2 and the second connecting lines BH1 to BH3 may have, for example, a same layered structure in the same or similar manner as described above with regards to the first dummy lines DM1 and the first connecting lines BV1 to BV3.

In a part of the display area DA, one data line (for example, DL1) and one first or third connecting line (for example, BV1') may be adjacent to each other. Also, in a part of the display area DA, one data line (for example, DL1) and one first dummy line DM1 may be adjacent to each other. Here, "being adjacent to each other" may denote being adjacent to each other in the pixel circuit PC in one or a pixel P as described above with reference to FIG. 6. Additional contact holes 1158 and 1175 may also be provided (see FIGS. 6 and 9).

The first connecting lines BV1 to BV3 may be respectively electrically connected to the second connecting lines BH1 to BH3 via first contact holes B-CNT1, and the second connecting lines BH1 to BH3 may be respectively electrically connected to the third connecting lines BV1' to BV3' via second contact holes B-CNT2.

In an embodiment, some or a predetermined number of first connecting lines BV1 and BV2 may overlap the second dummy lines DM2, and at the overlapping portion, the first connecting lines BV1 and BV2 and the second dummy lines DL2 may not be electrically connected to each other. Therefore, a contact hole may not be provided at the overlapping portion between the first connecting lines BV1 and BV2 and the second dummy lines DM2.

Similarly, some or a predetermined number of second connecting lines BH1 and BH2 may overlap the first dummy lines DM1, and at the overlapping portion, the second connecting lines BH1 and BH2 may not be electrically connected to the first dummy lines DM1. Therefore, a contact hole may not be provided at the overlapping portion between the second connecting lines BH1 and BH2 and the first dummy lines DM1.

Referring to FIG. 13, a connecting relationship on the outer portion of the display area DA, where the first to third connecting wires BL1 to BL3 may be arranged or disposed, is shown. It may be understood that FIG. 13 shows FIG. 4B described above in more detail. FIG. 14 shows a layout of pixels of FIG. 13 in more detail.

Referring to FIG. 13 and FIG. 14, the first to third input lines IL1 to IL3 and the first to third data lines DL1 to DL3 electrically connected to the first to third connecting wires BL1 to BL3 may be the same as those of FIG. 4B. In FIG. 13, the first to third connecting wires BL1 to BL3 respectively include the first connecting lines BV1 to BV3, the second connecting lines BH1 to BH3, and the third connecting lines BV1' to BV3'.

The first connecting lines BV1 to BV3 may be respectively electrically connected to the first to third input lines IL1 to IL3 via the second contact hole CNT2, and the third connecting lines BV1' to BV3' may be electrically connected to the first to third data lines DL1 to DL3 via the first contact hole CNT1. As described above with reference to FIG. 11, the second connecting lines BH1 to BH3 may be electrically connected to the first connecting lines BV1 to BV3 and the third connecting lines BV1' to BV3' via the first contact holes B-CNT1 and the second contact holes B-CNT2 at opposite ends thereof.

As shown in FIG. 13, the second connecting lines BH1 to BH3 may partially overlap the fourth to sixth data lines DL4 to DL6 in the second area DA2. For example, the second connecting lines BH1 to BH3 may be provided to pass or extend below the fourth to sixth data lines DL4 to DL6 in the second area DA2.

In FIG. 14, the first dummy lines DM1 and the second dummy lines DM2 are also shown in addition to the first to third connecting wires BL1 to BL3. The first dummy lines DM1 and the second dummy lines DM3 may denote remaining wirings after arranging the first to third connecting wires BL1 to BL3. The first to third connecting lines BL1 to BL3 may be provided in a case that the first connecting lines BV1 to BV3, the second connecting lines BH1 to BH3, and the third connecting lines BV1' to BV3' may be in contact with and electrically connected to one another at preset points, and remaining wirings remain in the display area DA as the first dummy lines DM1 and the second dummy lines DM2 due to the disconnection portions dc1 and dc2 (see FIG. 12).

Figure 15:
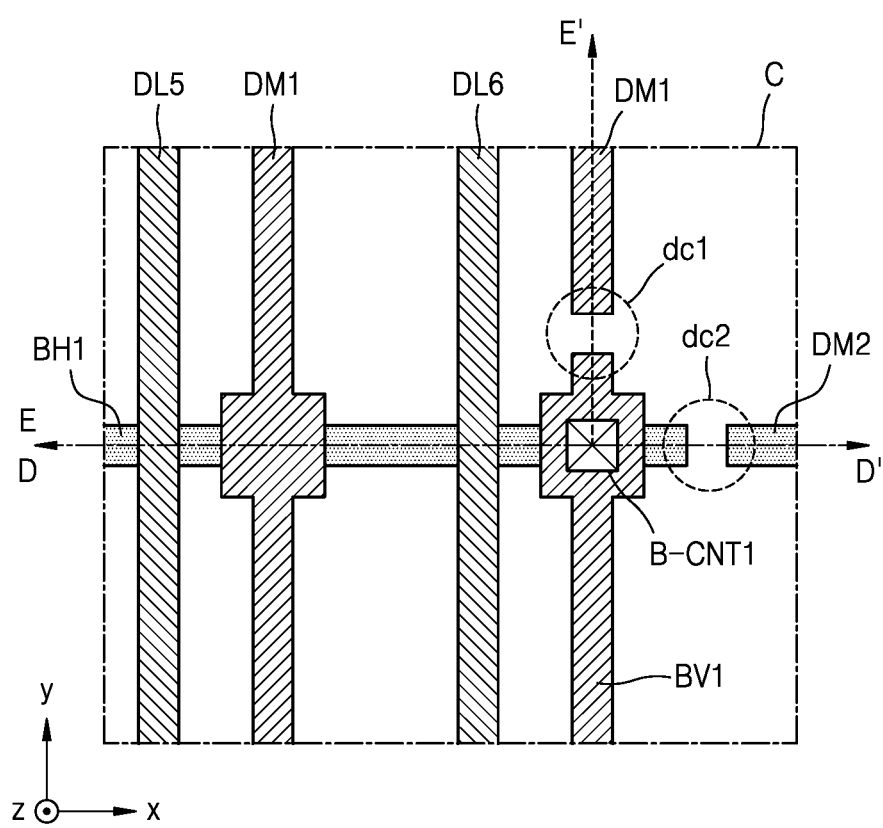
FIG. 15 is a plan view showing an enlarged view of a region C in FIG. 12.
Figure 16A:
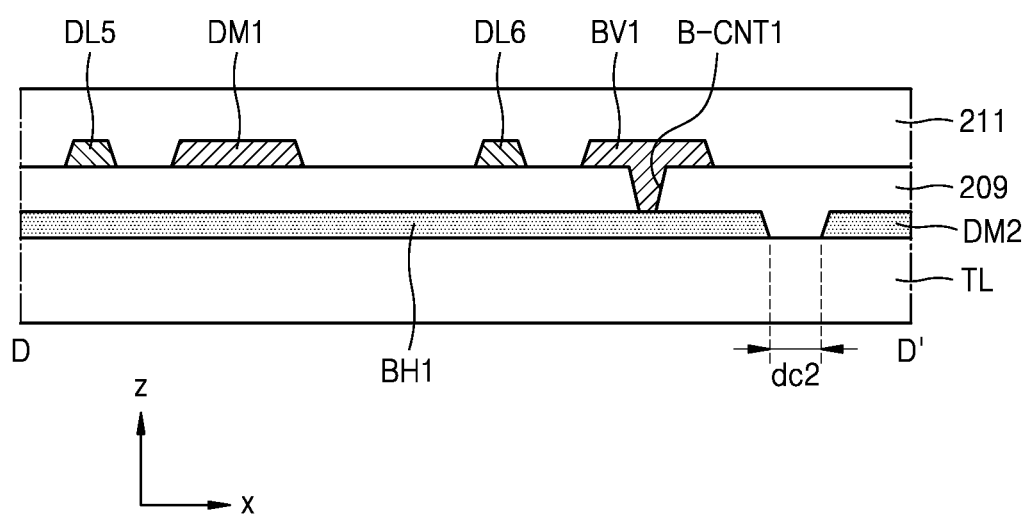
FIGS. 16A and 16B are schematic cross-sectional views taken along line D-D' and line E-E' of FIG. 15.
Figure 16B:
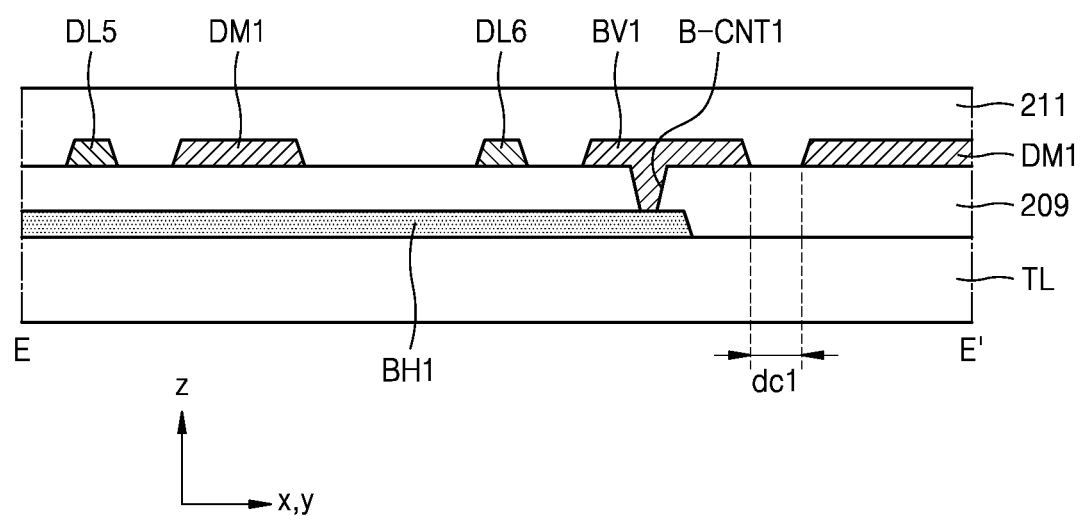

FIG. 15 is a plan view showing an enlarged view of a region C in FIG. 14, and FIGS. 16A and 16B are schematic cross-sectional views of the region C taken along line D-D' and line E-E' of FIG. 15.

Referring to FIGS. 15, 16A, and 16B, the second connecting line BH1 and the second dummy line DM2 may be on a thin film transistor layer TL. Referring to FIG. 8 together, the thin film transistor layer TL may denote layers under or below the substrate and the fifth contact metal SD1b. In an embodiment, the second interlayer insulating layer 208 may be right under or below the second connecting line BH1. The first connecting line BV1, the first dummy lines DM1, and the data lines (for example, DL5 and DL6) may be disposed above the second connecting line BH1 and the second dummy line DM2 with the first planarization layer 209 disposed therebetween. The second planarization layer 211 may be on the first connecting line BV1, the first dummy lines DM1, and the data lines (for example, DL5 and DL6).

Referring to FIG. 16A, the second connecting line BH1 and the second dummy line DM2 may be spaced apart from each other to be disconnected at the same layer. The second disconnection portion dc2 may be disposed between the second connecting line BH1 to BH3 and the second dummy line DM2. The first connecting line BV1 may be electrically connected to the second connecting line BH1 via the first contact holes B-CNT1 defined in the first planarization layer 209. The first dummy lines DM1 and the data lines (for example, DL5 and DL6) may be on the second connecting line BH1, but second connecting line BH1 may not be electrically connected to, but may partially overlap, the first dummy lines DM1 and the data lines (for example, DL5 and DL6).

Referring to FIG. 16B, the first connecting line BV1 and the first dummy line DM1 may be apart from each other to be disconnected at the same layer. The first disconnection portion dc1 may be disposed between the first connecting line BV1 and the first dummy lines DM1.

Figure 17:
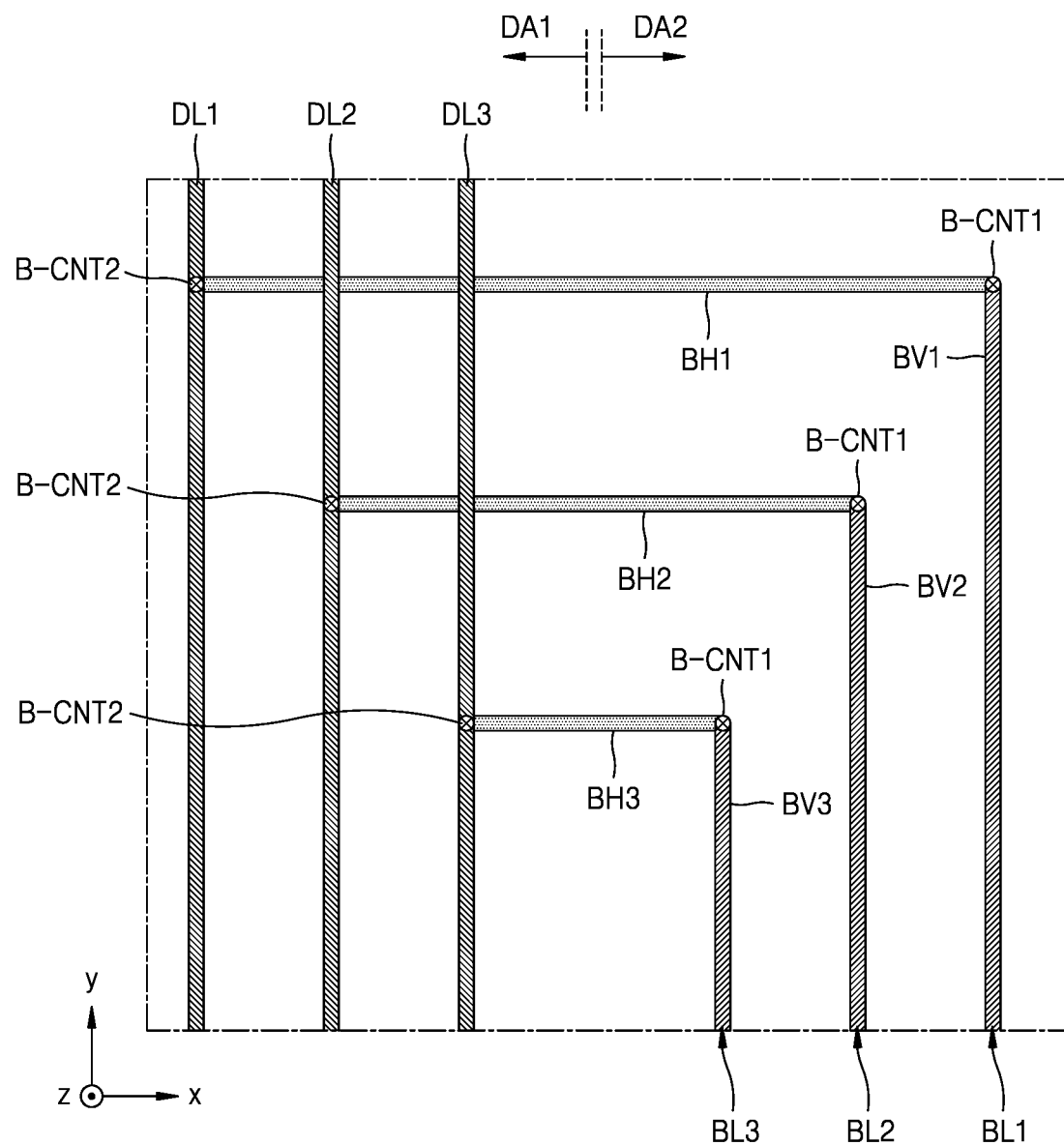
FIG. 17 is a conceptual diagram showing a portion or region of a display area, in which a connecting wire is arranged or disposed, in a display apparatus according to an embodiment.
Figure 18:
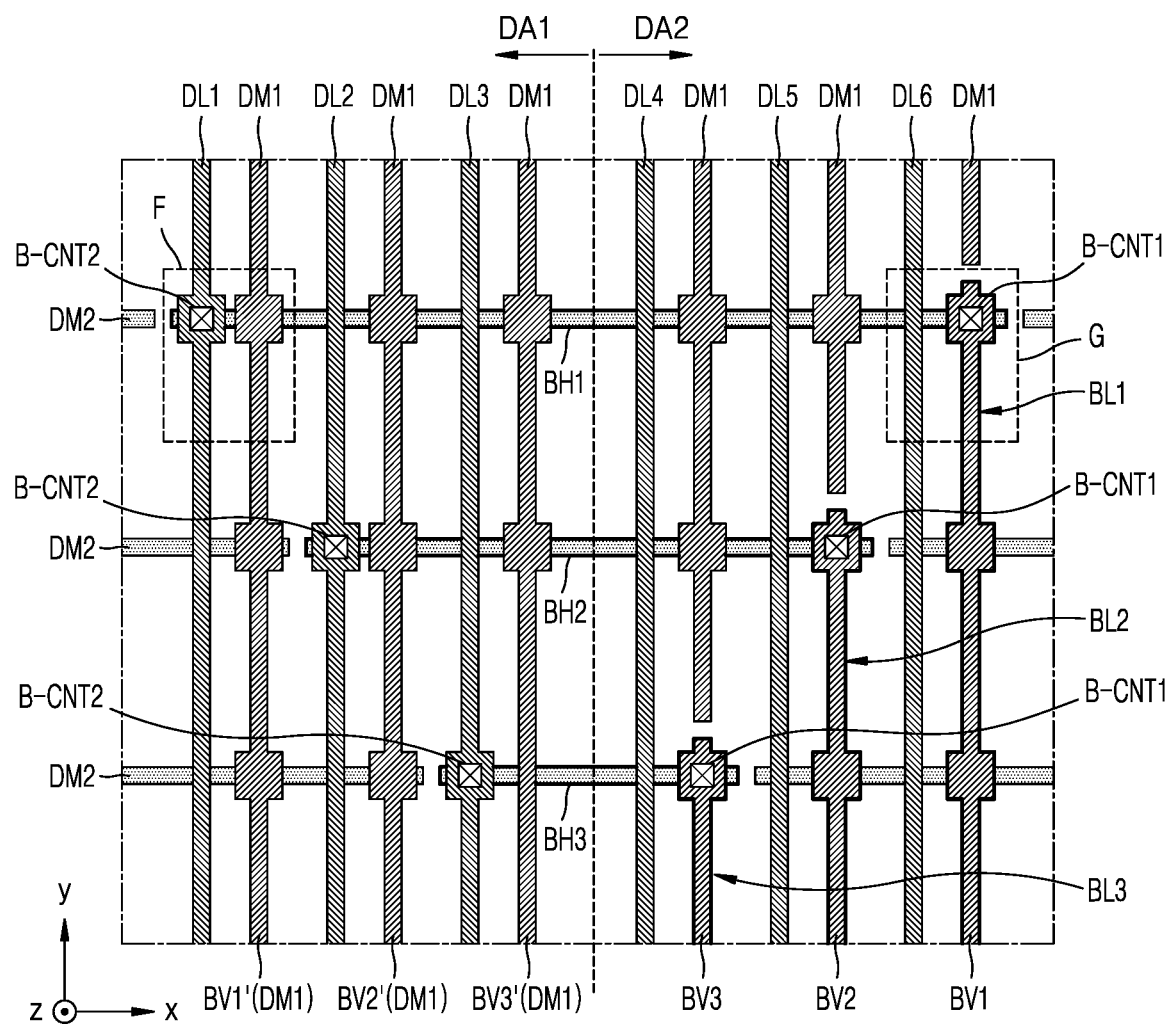
FIG. 18 is a plan view showing the display area of FIG. 17.
Figure 19A:
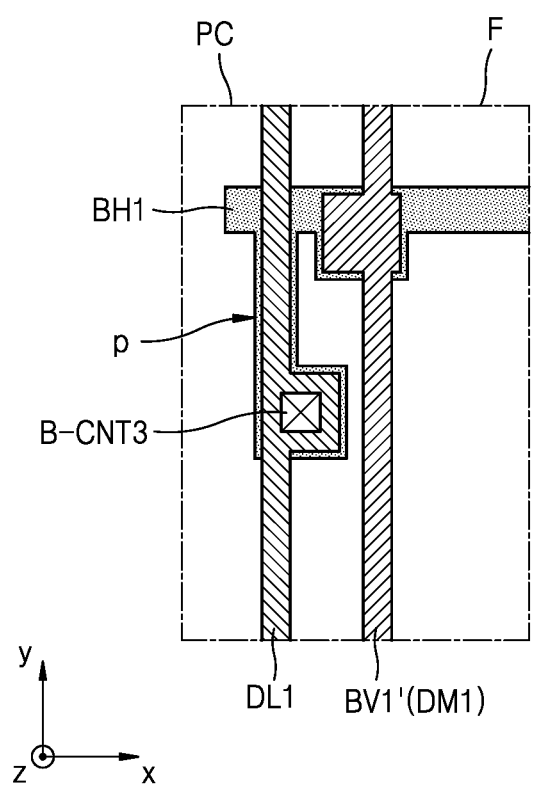
FIGS. 19A and 19B are plan views showing an enlarged view of a region F in FIG. 17.
Figure 19B:
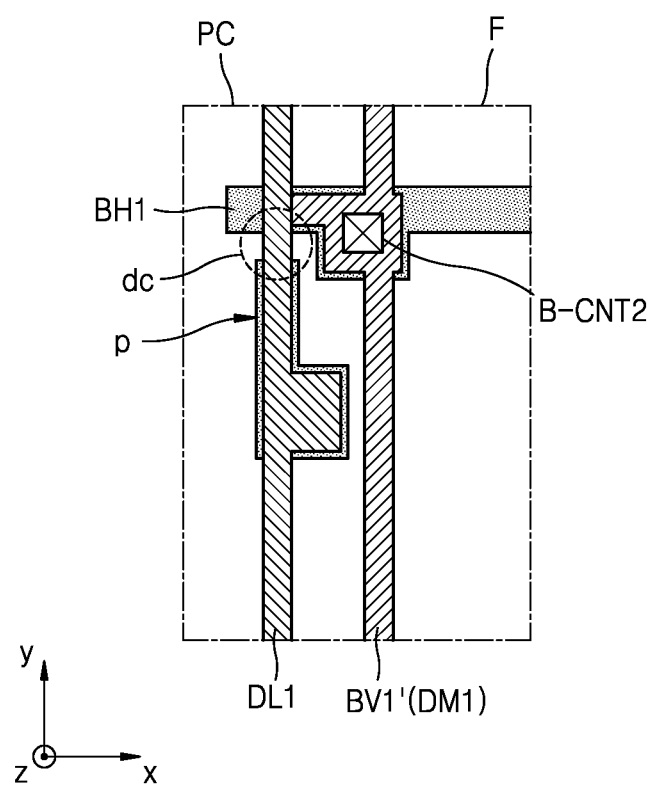
Figure 19C:
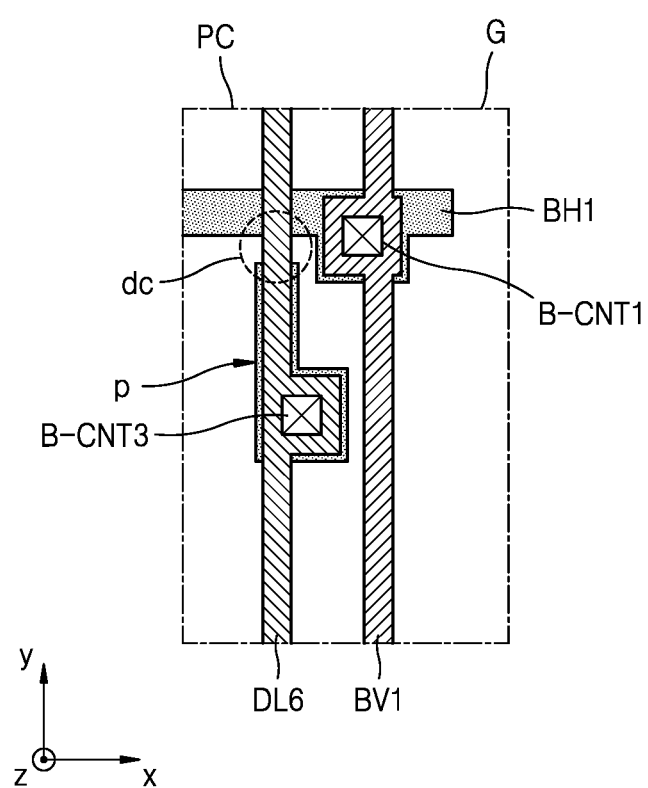
FIGS. 19C and 19D are plan views showing an enlarged view of a region G in FIG. 17.
Figure 19D:
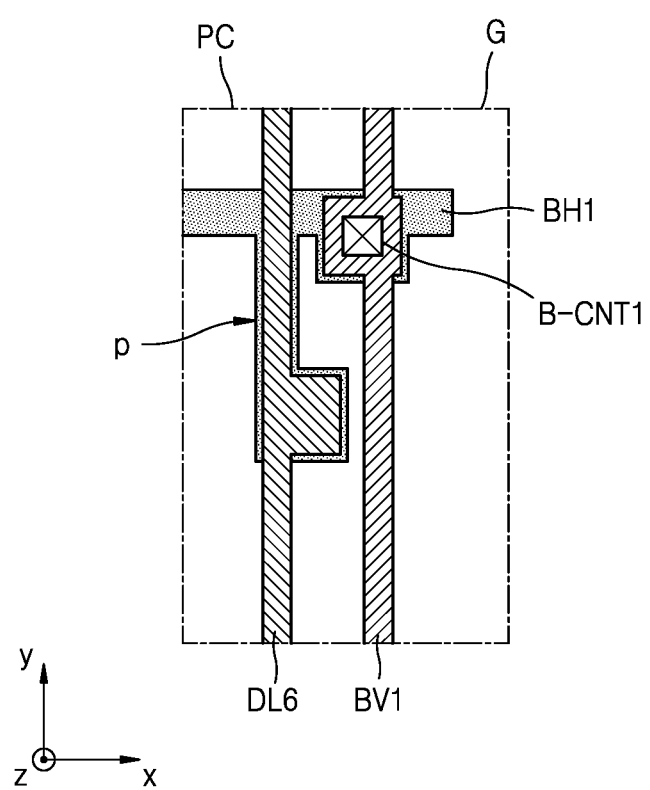

FIG. 17 is a conceptual diagram showing a portion of a display area, in which connecting wires may be arranged or disposed, in a display apparatus according to an embodiment, and FIG. 18 is a plan view showing of FIG. 17 in more detail. FIGS. 19A and 19B are plan views showing an enlarged view of a portion F of FIG. 17, and FIGS. 19C and 19D are plan views showing an enlarged view of a portion G of FIG. 17.

An embodiment illustrated with reference to FIGS. 17 and 18 is similar to that of FIGS. 11 and 14, except that the first to third data lines DL1 to DL3 may be respectively electrically connected to the first to third connecting wires BL1 to BL3 in the display area DA, for example, the first area DA1. In other words, in an embodiment, the second connecting lines BH1 to BH3 may be directly electrically connected to the first to third data lines DL1 to DL3, not the third connecting lines BV1' to BV3'. Therefore, in an embodiment illustrated in FIGS. 17 and 18, the third connecting lines BV1' to BV3' may be provided as the first dummy lines DM1 to which an electrical signal is not applied. Other components are the same as those of FIGS. 11 and 14, and thus, differences will be described below.

Referring to FIG. 17, the first to third connecting wires BL1 to BL3 may respectively include the first connecting lines BV1 to BV3 extending in the first direction (for example, y-direction) and the second connecting lines BH1 to BH3 extending in the second direction (for example, x-direction). Here, the first connecting lines BV1 to BV3 may be electrically connected to the second connecting lines BH1 to BH3, and the second connecting lines BH1 to BH3 may be directly electrically connected to the first to third data lines DL1 to DL3.

For example, the first connecting wire BL1 may include the first connecting line BV1 and the second connecting line BH1. Based on the second connecting line BH1, the first connecting line BV1 may be electrically connected to an end of the second connecting line BH1 and the first data line DL1 may be electrically connected to an opposite end of the second connecting line BH1. The above connecting relation may be also applied to the second connecting wire BL2 and the third connecting wire BL3.

In more detail, referring to FIG. 18, the first connecting lines BV1 to BV3 may be respectively electrically connected to the second connecting lines BH1 to BH3 via the first contact holes B-CNT1, and the second connecting lines BH1 to BH3 may be respectively electrically connected to the first to third data lines DL1 to DL3 via a third contact hole B-CNT3. Therefore, the third connecting lines BV1' to BV3' that may be respectively adjacent to the first to third data lines DL1 to DL3 may be the first dummy lines DM1 to which the electrical signals may not be applied.

FIGS. 19A and 19B show connecting relations among the wirings at a portion where the third contact hole B-CNT3 may be provided, and FIGS. 19C and 19D show connecting relations among the wirings at a portion where the first contact holes B-CNT1 may be provided. FIGS. 19A to 19D show the pixel circuit PC in one or a pixel P including the first contact holes B-CNT1 or the third contact hole B-CNT3.

Referring to FIG. 19A, the second connecting line BH1 may be directly connected to the first data line DL1 via the third contact hole B-CNT3. In an embodiment, the second connecting line BH1 partially extends in one direction (for example, -y direction) as shown in FIG. 19A, and an end portion of an extension portion p may be electrically connected to the first data line DL1. The third contact hole B-CNT3 may not be only provided at the end portion of the extension portion p, but may be switched to any portion of an overlapping region between the second connecting line BH1 and the first data line DL1.

Because the first connecting wire BL1 may be electrically connected to the first data line DL1 in the first area DA1 in an embodiment, the third connecting line BV1' that may be adjacent to the first data line DL1 may be provided as the first dummy line DM1 that may not be electrically connected to the second connecting line BH1 in FIG. 19A.

FIG. 19B is similar to FIG. 19A, except that the first data line DL1 may be directly electrically connected to the third connecting line BV1'. For example, the first data line DL1 and the third connecting line BV1' may be integrally provided. Therefore, an input signal transferred through the second connecting line BH1 may be transferred to the first data line DL1 that may be directly electrically connected to the third connecting line BV1' through the second contact hole B-CNT2. In FIG. 19B, the extension portion p of the second connecting line BH1 and the first data line DL1 may be in electrical contact with each other via the third contact hole B-CNT3. However, because a disconnection portion dc may be disposed between the second connecting line BH1 and the extension portion p, the first data line DL1 may receive the input signal through the third connecting line BV1', not via the second connecting line BH1.

Referring to FIG. 19C, the second connecting line BH1 may be electrically connected to the first connecting line BV1 via the first contact holes B-CNT1. In the pixel circuit PC of one or a pixel P including the first contact holes B-CNT1, the data line (for example, DL6) that may be adjacent to the first connecting line BV1 may not be connected to the second connecting line BH1. As described above with reference to FIG. 19A, in a case that the second connecting line BH1 has the extension portion p that extends in one direction (for example, -y direction), the disconnection portion dc, for example, a predetermined gap, may be provided between the extension portion p and the second connecting line BH1. For example, the second connecting line BH1 extending in the second direction (for example, x-direction) and the extension portion p may be disconnected from each other, and thus, the second connecting line BH1 and the data line (for example, DL6) may not be electrically connected to each other.

In another embodiment, as shown in FIG. 19D, the second connecting line BH1 partially may include the extension portion p extending in one direction (for example, -y direction), and a contact hole may not be provided at a portion where the second connecting line BH1 and the first data line DL1 may overlap each other. In this case, the contact hole may not be provided or a dummy contact hole, by which the electrical connection may not be made, may be provided at the portion where the second connecting line BH1 and the first data line DL1 overlap each other.

Figure 20:
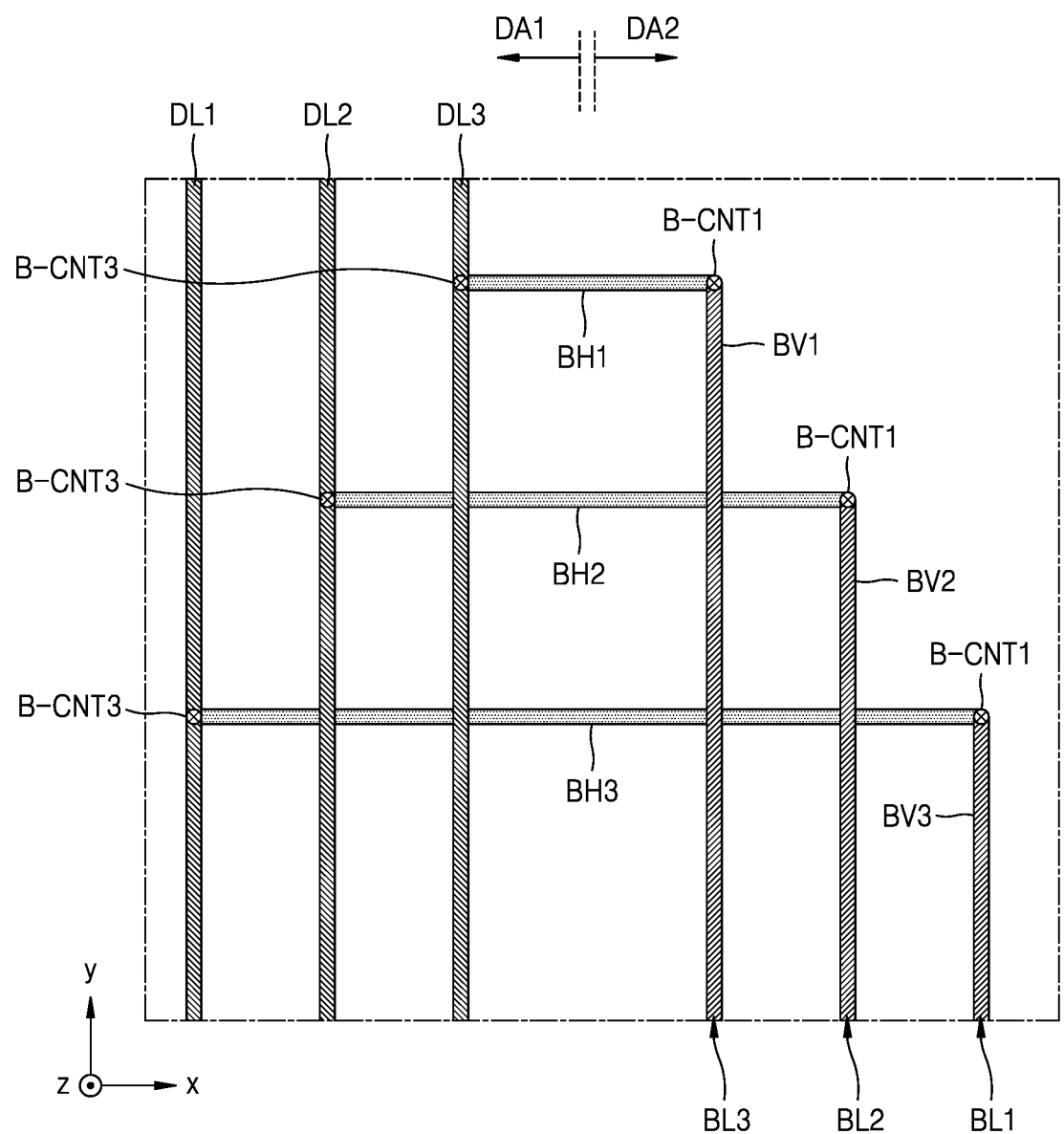
FIG. 20 is a conceptual diagram showing a portion of a display area, in which connecting wires are arranged or disposed, in a display apparatus according to an embodiment.
Figure 21:
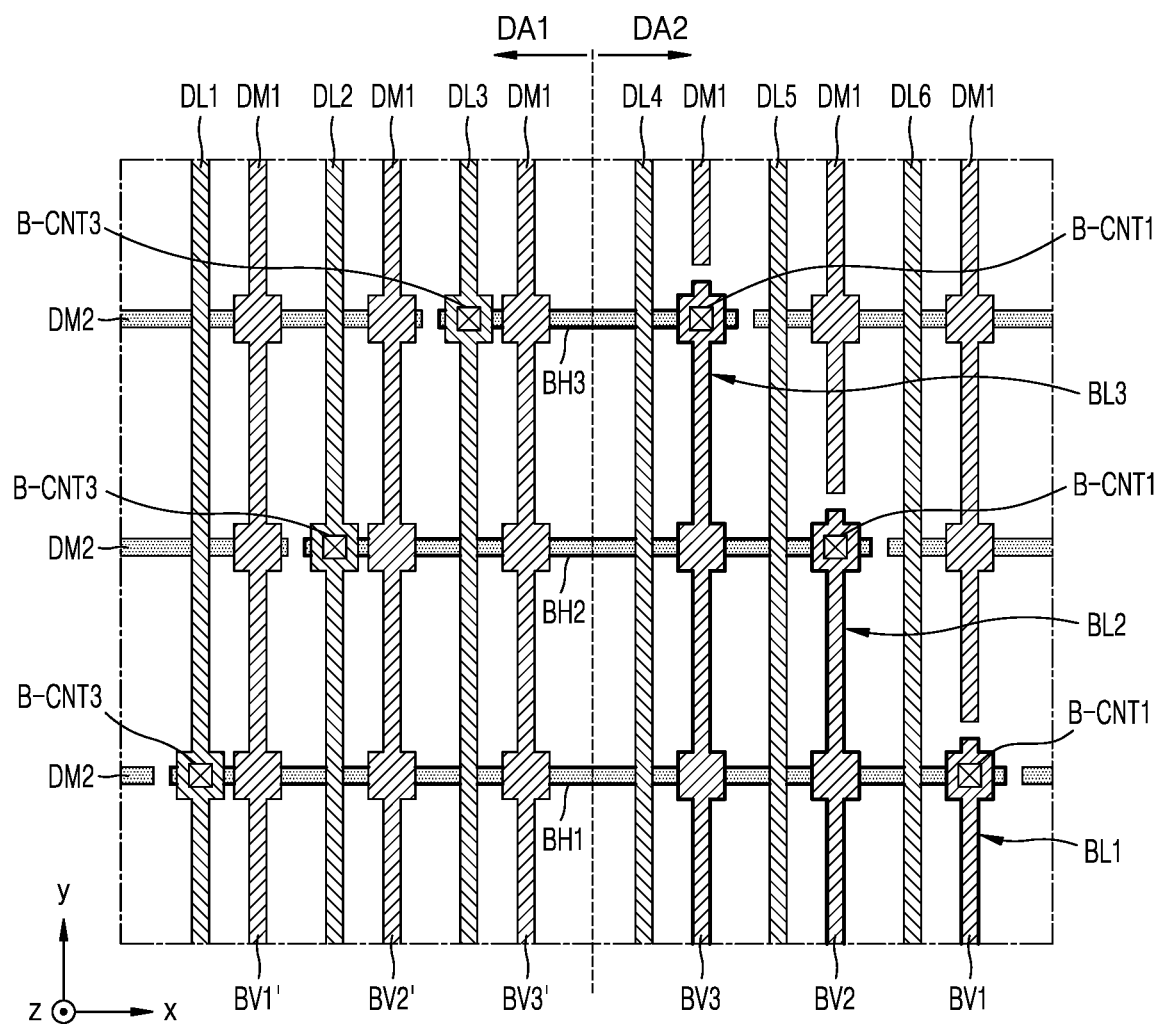
FIG. 21 is a plan view showing the display area of FIG. 20.

FIG. 20 is a conceptual diagram showing a portion of a display area, in which connecting wires may be arranged or disposed, in a display apparatus according to an embodiment, and FIG. 21 is a plan view showing of FIG. 20 in more detail.

An embodiment illustrated with reference to FIGS. 20 and 21 may be similar to that of FIGS. 17 and 18 described above, except that the first to third connecting wires BL1 to BL3 electrically connected respectively to the first to third data lines DL1 to DL3 may have the same length as one another. Other components may be the same as those of FIGS. 11 and 14, and thus, differences will be described below.

Referring to FIGS. 20 and 21, the first to third connecting wires BL1 to BL3 may respectively include the first connecting lines BV1 to BV3 extending in the first direction (for example, y-direction) and the second connecting lines BH1 to BH3 extending in the second direction (for example, x-direction). Here, the first connecting lines BV1 to BV3 may be electrically connected to the second connecting lines BH1 to BH3, and the second connecting lines BH1 to BH3 may be directly electrically connected to the first to third data lines DL1 to DL3.

In an embodiment, the first to third connecting wires BL1 to BL3 may have the same length as one another. For example, lengths of the first connecting lines BV1 to BV3 may be increased away from the first area DA1. However, lengths of the second connecting lines BH1 to BH3 may be reduced away from the second peripheral area PA2. Therefore, in the first connecting wire BL1, the length of the first connecting line BV1 may be reduced, but the length of the second connecting line BH1 electrically connected to the first connecting line BV1 may be increased. In the third connecting wire BL3, the length of the first connecting line BV3 may be increased, but the second connecting line BH3 electrically connected to the first connecting line BV1 may be reduced.

For example, the first to third connecting wires BL1 to BL3 may have similar lengths by adjusting the lengths of the second connecting lines BH1 to BH3 inversely proportional to the lengths of the first connecting lines BV1 to BV3. As such, the lengths of paths from the input lines to the data lines may be similar with respect to the first to third data lines DL1 to DL3 electrically connected to the first to third connecting wires BL1 to BL3, and thus, loads applied to the first to third connecting lines BL1 to BL3 may be consistent and displaying quality may be improved.

Figure 22A:
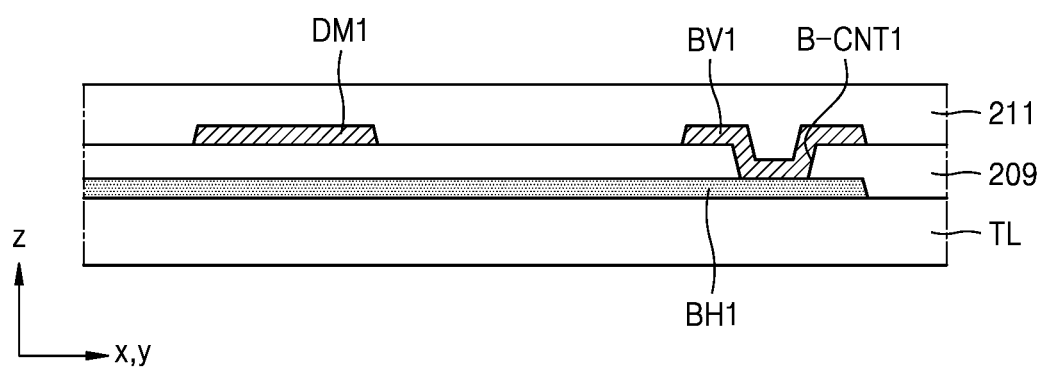
FIGS. 22A to 22C are schematic cross-sectional views showing connecting states among wires.
Figure 22B:
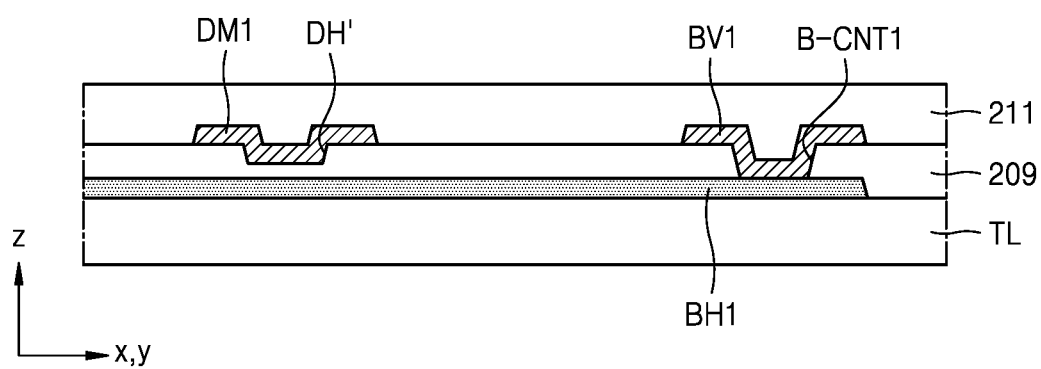
Figure 22C:
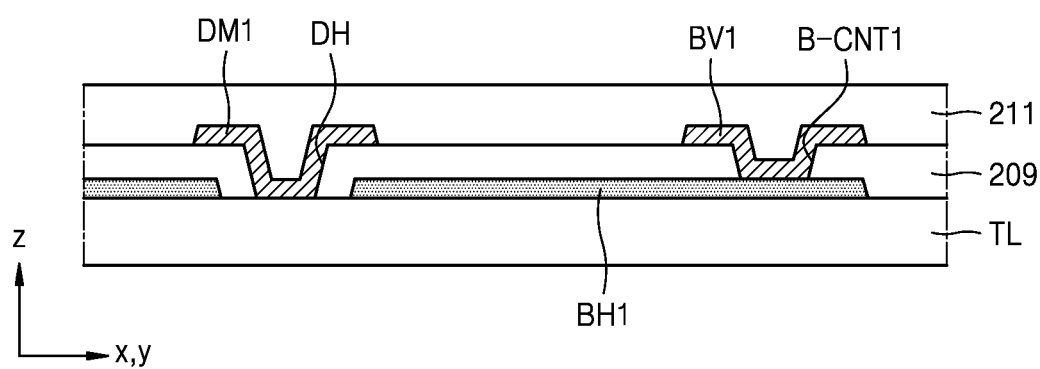

FIGS. 22A to 22C are schematic cross-sectional views showing connecting states among wires.

Referring to FIGS. 22A to 22C, the first connecting line BV1 and the second connecting line BH1 may be electrically connected to each other on the thin film transistor layer TL via the first contact holes B-CNT1 defined in the first planarization layer 209.

The second connecting line BH1 may partially overlap the first dummy line DM1. Here, the second connecting line BH1 and the first dummy line DM1 may not be in contact with each other at the overlapping region and may not be electrically connected to each other. In an embodiment, the second connecting line BH1 and the first dummy line CM1 may be insulated from each other with the first planarization layer 209 disposed therebetween as shown in FIG. 22A.

In an embodiment, as shown in FIG. 22B or 22C, a dummy groove DH' or a dummy hole DH may be provided disposed between the second connecting line BH1 and the first dummy line DM1. Referring to FIG. 22B, the first planarization layer 209 disposed between the second connecting line BH1 and the first dummy line DM1 may include the dummy groove DH' engraved towards the thin film transistor layer TL (for example, −z direction). Referring to FIG. 22C, the dummy hole DH penetrating through the first planarization layer 209 may be above the second connecting line BH1. In this case, the second connecting line BH1 is not to be on the portion where the dummy hole DH may be provided. In a case that the second connecting line BH1 is in the dummy hole DH, the dummy hole DH may be a contact hole, and in this case, an unintentional electrical connection may occur and may cause defects. Therefore, the second connecting line BH1 may be required to be disconnected or removed from the portion where the dummy hole DH is formed. The first connecting line BV1 on the dummy hole DH may be partially in contact with the second interlayer insulating layer 208 via the dummy hole DH.

As described above, because the dummy groove DH' or the dummy hole DH may be provided disposed between the second connecting line BH1 to BH3 and the first dummy line DM1, a boundary visibility caused due to the step of the first contact holes B-CNT1 may be effectively reduced.

Figure 23:
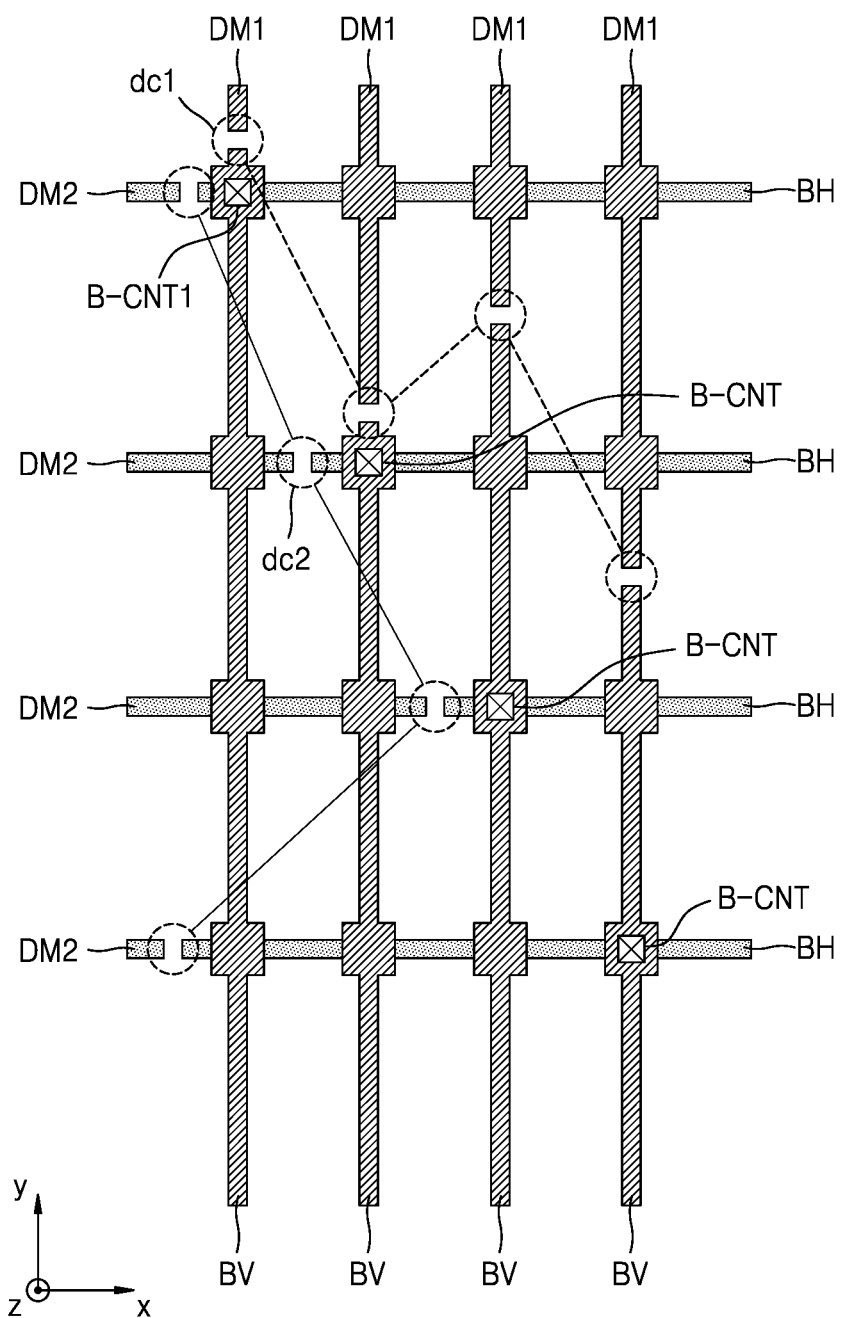
FIG. 23 is a plan view showing a portion of a display apparatus according to an embodiment.

FIG. 23 is a plan view showing a portion of a display apparatus according to an embodiment.

Referring to FIG. 23, the first connecting lines BV may be separated from one another and may extend in the first direction (for example, y-direction), and the second connecting lines BH may be separated from one another and extend in the second direction (for example, x-direction). As described above, in a case that the connecting wire BL is implemented, the connecting wire BL may include at least one first connecting line BV and at least one second connecting line BH. Because the first connecting line BV and the second connecting line BH may be electrically connected to each other via a contact hole B-CNT, the connecting wire BL may be obtained.

The first dummy lines DM1 may be provided in the direction in which the first connecting lines BV extend. Also, the second dummy lines DM2 may be provided in the direction in which the second connecting lines BH extend. The first disconnection portions dc1 may be respectively disposed between the first connecting lines BV and the first dummy lines DM1, and the second disconnection portions dc2 may be respectively disposed between the second connecting lines BH and the second dummy lines DM2.

Referring to FIG. 11, for example, the first and second disconnection portions dc1 and dc2 may be arranged or disposed regularly in the previous embodiments. For example, the first and second disconnection portions dc1 and dc2 may be arranged or disposed in a diagonal direction which crosses or intersects the first direction (for example, y-direction) and the second direction (for example, x-direction).

However, in an embodiment illustrated with reference to FIG. 23, the first and second disconnection portions dc1 and dc2 may be arranged or disposed randomly, for example, irregularly. For example, a virtual line connecting the first disconnection portions dc1 and a virtual line connecting the second disconnection portions dc2 may not be straight lines, but may be in zigzags. The first and second disconnection portions dc1 and dc2 may not be necessarily be adjacent to the contact hole B-CNT, provided that they may be disconnected at least at some or a predetermined number of portions. As described above, in a case that the first and second disconnection portions dc1 and dc2 may be irregularly arranged or disposed, the boundary visibility caused steps of the first and second disconnection portions dc1 and dc2 may be effectively reduced.

Figure 24:
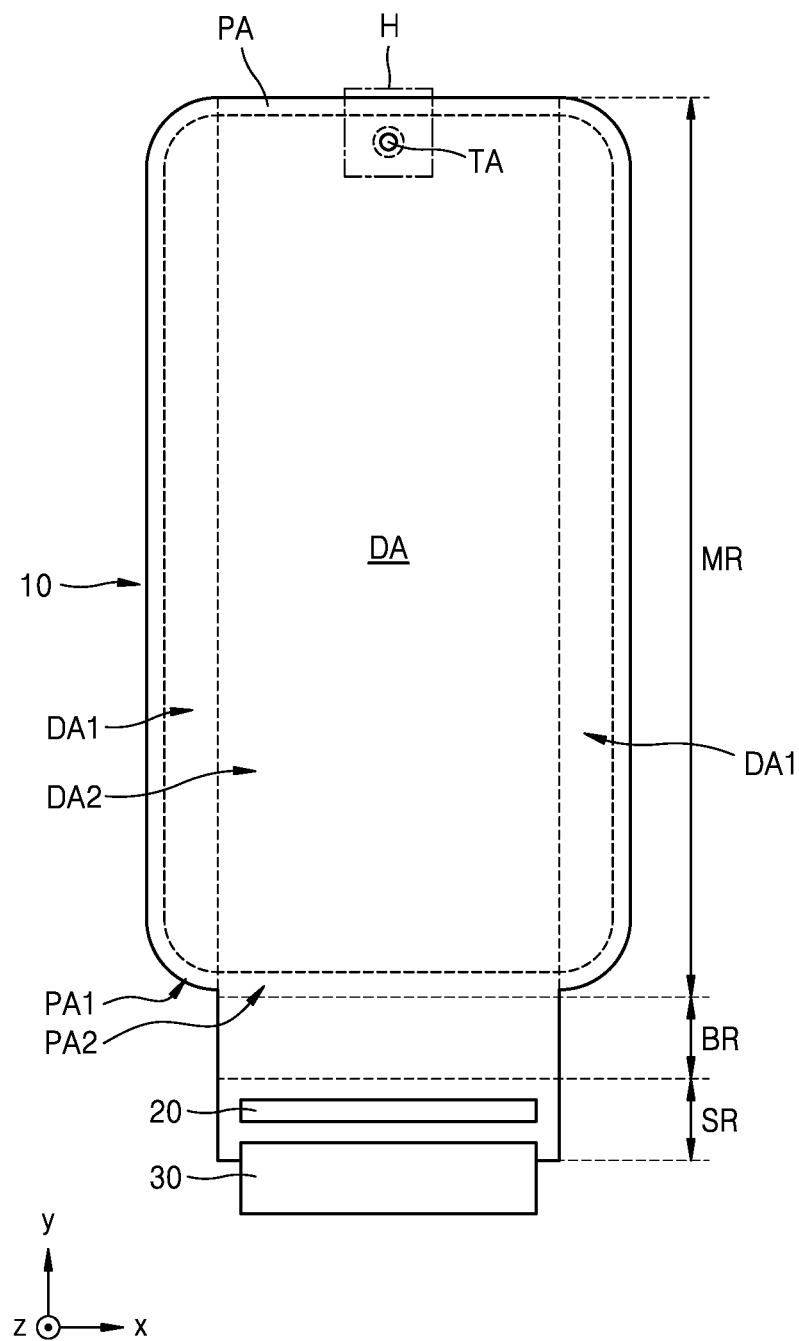
FIG. 24 is a plan view of a display apparatus according to an embodiment.
Figure 25:
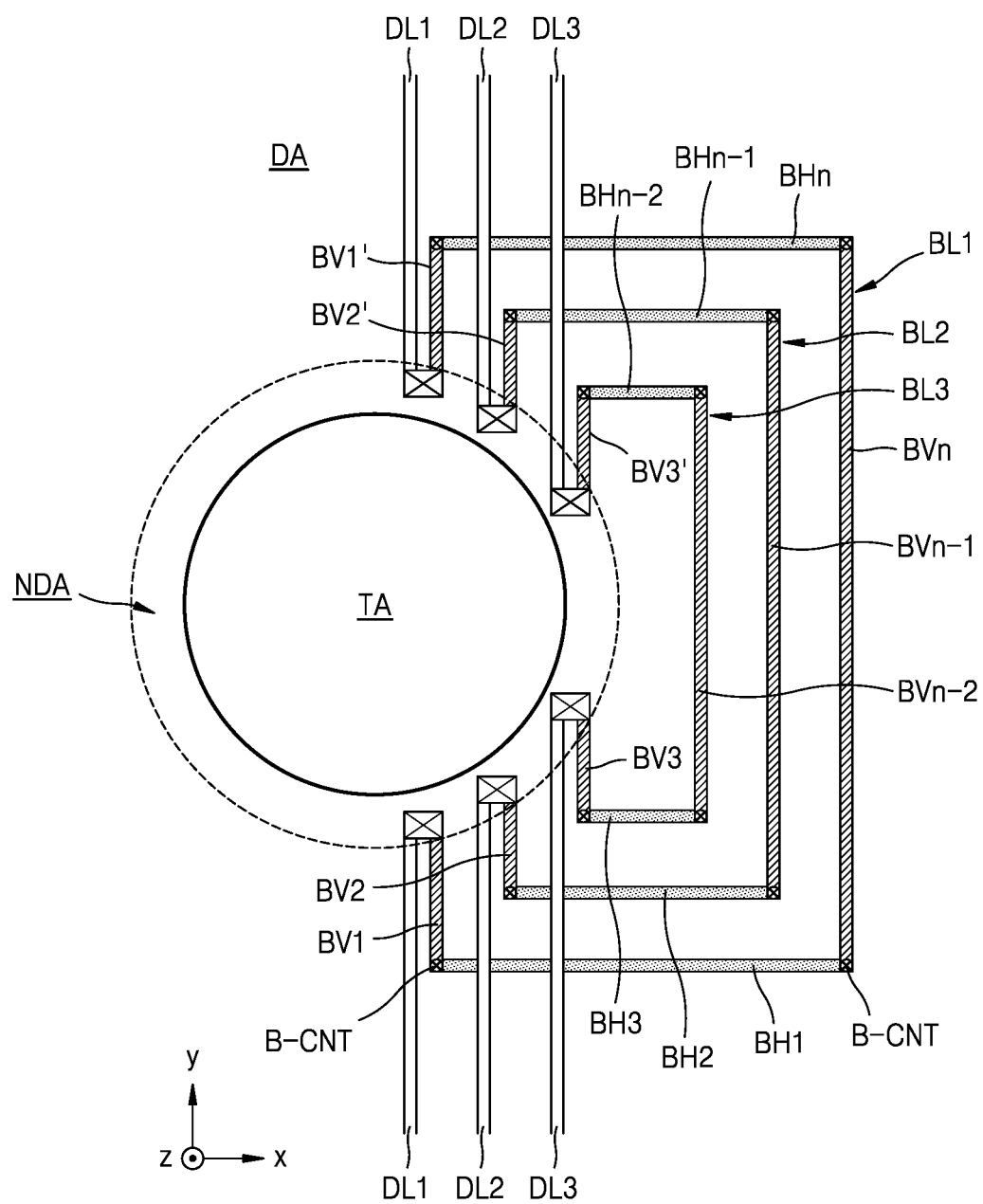
FIG. 25 is an enlarged view of a region H in FIG. 24.

FIG. 24 is a plan view of a display apparatus according to an embodiment, and FIG. 25 is an enlarged view of a portion H of FIG. 24.

The display apparatus of FIG. 24 may be different from the display apparatus of FIG. 1 in that the display area DA (for example, the second area DA2) may include a transmission area TA. Other components may be the same as those of the display apparatus of FIG. 1. In correspondence with the transmission area TA, a component (not shown) may be disposed under or below a display panel 10.

In an embodiment, the component may include an electronic element using light or sound. For example, the electronic element may include a sensor outputting and/or receiving light such as an infrared-ray sensor, a camera capturing an image by receiving light, a sensor for outputting and sensing light or sound to measure a distance or recognize a fingerprint, a small-sized lamp illuminating light, a speaker for outputting sound, for example. The electronic element using light may use light of various wavelength bands such as visible light, infrared-ray light, ultraviolet rays, for example. Light and/or sound output from the component to outside or proceeding from outside to the electronic element may transmit through the transmission area TA.

Referring to FIG. 25, pixels may not be in the transmission area TA. Therefore, the first to third data lines DL1 to DL3 extending in the first direction (for example, y-direction) may be disconnected above and under or below the transmission area TA. In this case, the first to third data lines DL1 to DL3 that may be disconnected at the transmission area TA may be connected via the first to third connecting wires BL1 to BL3.

In an embodiment, structures of the first to third connecting wires BL1 to BL3 may be similar to those of the above-described embodiments. For example, each of the first to third connecting wires BL1 to BL3 may include at least one of the first connecting lines BV1 to BVn and at least one of the second connecting lines BH1 to BHn. Here, the first connecting lines BV1 to BVn extend in the first direction (for example, y-direction) and the second connecting lines BH1 to BHn may extend in the second direction (for example, x-direction).

The first connecting wire BL1 electrically connected to the first data line DL1 may include the first connecting lines BV1, BV1', and BVn and the second connecting lines BH1 and BHn. The second connecting wire BL2 electrically connected to the second data line DL2 may include the first connecting lines BV2, BV2', and BVn-1 and the second connecting lines BH2 and BHn-1. The third connecting wire BL3 electrically connected to the third data line DL3 may include the first connecting lines BV3, BV3', and BVn-2 and the second connecting lines BH3 and BHn-2.

In an embodiment, the first to third data lines DL1 to DL3 and the first connecting lines BV1 to BVn may be at the same layer. The second connecting lines BH1 to BHn may be on a different layer from that of the first connecting lines BV1 to BVn, for example, may be under or below the first connecting lines BV1 to BVn. Therefore, the first connecting lines BV1 to BVn and the second connecting lines BH1 to BHn may be arranged or disposed with an insulating layer disposed therebetween, and may be electrically connected to each other via the contact hole B-CNT defined in the insulating layer.

For example, the first data line DL1 under or below the transmission area TA may be in electrical contact with an end of the first connecting line BV1 in the non-display area NDA disposed between the display area DA and the transmission area TA. The other end of the first connecting line BV1 may be in electrical contact with an end of the second connecting line BH1, and the other end of the second connecting line BH1 may be in electrical contact with an end of the first connecting line BVn. The other end of the first connecting line BVn may be in electrical contact with an end of the second connecting line BHn, and the other end of the second connecting line BHn may be in electrical contact with the first connecting line BV1'. The first data line DL1 on the transmission area TA may be in electrical contact with the other end of the first connecting line BV1' in the non-display area NDA.

Detailed connecting relations and stack structure of the one or more first connecting lines BV1 to BVn and one or more second connecting lines BH1 to BHn included in the first to third connecting wires BL1 to BL3 may be the same as those of the above-described embodiments.

The display apparatus has been described, but one or more embodiments of the disclosure are not limited thereto. For example, a method of manufacturing the display apparatus may be also included in the scope of the disclosure.

According to one or more embodiments of the disclosure, the display apparatus, in which the non-display area may be reduced and high quality images may be reproduced, may be implemented. However, the scope of the disclosure is not limited to the above effects.

While the disclosure has been shown and described with reference to embodiments thereof, it will be understood by those of ordinary skill in the art that various changes in form and details may be made therein without departing from the spirit and scope as defined by the following claims. Therefore, the scope sought to be protected of the disclosure shall be defined by the appended claims.

What is claimed is:

1. A display apparatus comprising:
    a substrate comprising a display area and a peripheral area adjacent to the display area;
    a first data line disposed in the display area, the first data line extending in a first direction;
    a first input line disposed in the peripheral area, the first input line extending from the peripheral area towards the display area; and
    a first connecting wire electrically connected to the first input line at a location in the peripheral area, the first connecting wire transferring a first input signal from the first input line to the first data line, wherein
    the first connecting wire comprises:
        a first connecting line disposed in the display area and extending in the first direction; and
        a second connecting line electrically connected to the first connecting line at a location in the display area and extending in a second direction intersecting the first direction, and
    the first connecting line and the second connecting line are disposed on different layers.

2. The display apparatus of claim 1, further comprising a data pad portion disposed in the peripheral area, wherein
    an end of the first input line is electrically connected to the data pad portion, and
    another end of the first input line is electrically connected to the first connecting line.

3. The display apparatus of claim 1, further comprising a second data line disposed in the display area between the first connecting line and the first data line, the second data line being separated from the first data line and extending in the first direction,
    wherein the second connecting line extends below the second data line and is not electrically connected to the second data line.

4. The display apparatus of claim 1, wherein
the first connecting wire comprises a third connecting line disposed in the display area, the third connecting line extending in the first direction, and
the third connecting line is electrically connected to the first data line in the peripheral area.

5. The display apparatus of claim 1, wherein the second connecting line is electrically connected to the first data line in the display area.

6. The display apparatus of claim 1, further comprising:
a second data line disposed in the display area between the first connecting line and the first data line, the second data line being separated from the first data line and extending in the first direction;
a second input line disposed in the peripheral area, the first input line extending from the peripheral area towards the display area; and
a second connecting wire electrically connected to the second input line in the peripheral area, the second connecting line transferring a second input signal from the second input line to the second data line, wherein the second connecting wire comprises:
a third connecting line disposed in the display area and extending in the first direction; and
a fourth connecting line electrically connected to the third connecting line and extending in a second direction intersecting the first direction, and
a length of a path of the first connecting wire passing the first connecting line and the second connecting line is equal to a length of a path of the second connecting line passing the third connecting line and the fourth connecting line.

7. The display apparatus of claim 1, further comprising:
a first dummy line extending in the first direction from the first connecting line, the first dummy line being disconnected from the first connecting line; and
a second dummy line extending in the second direction from the second connecting line, the second dummy line being disconnected from the second connecting line.

8. The display apparatus of claim 7, wherein the first connecting line and the first dummy line have a same layered structure.

9. The display apparatus of claim 7, wherein the second connecting line and the second dummy line have a same layered structure.

10. The display apparatus of claim 7, wherein the first connecting wire is not electrically connected to the first dummy line and the second dummy line.

11. The display apparatus of claim 7, further comprising a third dummy line disposed in parallel with at least a portion of the first dummy line, wherein
the third dummy line extends over the second connecting line and is not in contact with the second connecting line, and
an insulating layer is disposed between the third dummy line and the second connecting line.

12. The display apparatus of claim 11, wherein the insulating layer includes a dummy groove located at a portion where the third dummy line and the second connecting line overlap each other.

13. The display apparatus of claim 11, wherein the insulating layer includes a dummy hole located in at least a portion of a region where the third dummy line is located.

14. The display apparatus of claim 13, wherein the second connecting line is not located in a portion of the dummy hole.

15. The display apparatus of claim 13, wherein
the dummy hole at least partially exposes a lower insulating layer disposed below the second connecting line, and
the third dummy line electrically contacts an upper surface of the lower insulating layer via the dummy hole.

16. The display apparatus of claim 7, further comprising a fourth dummy line disposed in parallel with at least a portion of the second dummy line, wherein
the fourth dummy line extends below the first connecting line and is not in contact with the first connecting line, and
an insulating layer is disposed between the fourth dummy line and the first connecting line.

17. The display apparatus of claim 1, wherein the first data line and the first connecting line of the first connecting wire are disposed on a same layer.

18. The display apparatus of claim 1, further comprising a pixel disposed in the display area and including a pixel circuit and a display element electrically connected to the pixel circuit, wherein the pixel circuit comprises:
a thin film transistor comprising a semiconductor layer and a gate electrode that at least partially overlaps the semiconductor layer;
a storage capacitor including the gate electrode as a first electrode and a second electrode disposed on the first electrode;
a node connecting line disposed on the second electrode, the node connecting line including an end electrically connected to the gate electrode; and
a conductive layer disposed on the node connecting line, the conductive layer completely overlapping the node connecting line.

19. The display apparatus of claim 18, wherein the pixel circuit further comprises a driving voltage line disposed on the conductive layer, the driving voltage line extending in the first direction and being electrically connected to the conductive layer.

20. The display apparatus of claim 19, wherein the driving voltage line, the first data line, and the first connecting line are disposed on a same layer.

21. The display apparatus of claim 18, wherein the second connecting line and the conductive layer are disposed on a same layer.

22. The display apparatus of claim 18, wherein
the pixel circuit comprises an initialization voltage line extending in the second direction, and
the initialization voltage line and the node connecting line are disposed on a same layer.

23. The display apparatus of claim 22, wherein the initialization voltage line overlaps the second connecting line.

24. A display apparatus comprising:
a substrate comprising a display area and a peripheral area adjacent to the display area;
a first data line and a second data line extending in a first direction in the display area, the first data line and the second data line being separated from each other;
an input line disposed in the peripheral area, the input line extending from the peripheral area towards the display area; and
a connecting wire including an end electrically connected to the input line and another end electrically connected to the first data line, the connecting wire partially passing the display area and partially arching around at least a portion of the display area, wherein the connecting wire comprises:
- a first connecting line extending in the first direction; and
- a second connecting line extending in a second direction intersecting the first direction, the second connecting line extends below the second data line, and the second connecting line and the first connecting line are disposed on different layers.

25. The display apparatus of claim 24, wherein the input line is bent at an angle of about 45° or less with respect to the first direction.

26. The display apparatus of claim 24, wherein the second connecting line is electrically connected to the first connecting line at a via located in the display area.

* * * * *